US009697111B2

(12) United States Patent
Yoo et al.

(10) Patent No.: US 9,697,111 B2
(45) Date of Patent: Jul. 4, 2017

(54) METHOD OF MANAGING DYNAMIC MEMORY REALLOCATION AND DEVICE PERFORMING THE METHOD

(71) Applicant: SAMSUNG ELECTRONICS CO., LTD., Suwon-Si, Gyeonggi-Do (KR)

(72) Inventors: Jun Hee Yoo, Ansan-Si (KR); Sung Hyun Lee, Gwangju-Si (KR); Dong Soo Kang, Hwaseong-Si (KR)

(73) Assignee: Samsung Electronics Co., Ltd. (KR)

( * ) Notice: Subject to any disclaimer, the term of this patent is extended or adjusted under 35 U.S.C. 154(b) by 448 days.

(21) Appl. No.: 13/957,968

(22) Filed: Aug. 2, 2013

(65) Prior Publication Data

US 2014/0040541 A1    Feb. 6, 2014

(30) Foreign Application Priority Data

Aug. 2, 2012    (KR) .................. 10-2012-0084768

(51) Int. Cl.
  *G11C 7/10*       (2006.01)
  *G06F 12/02*      (2006.01)
  *G06F 12/0864*    (2016.01)
  *G06F 12/0897*    (2016.01)
  *G11C 11/408*     (2006.01)

(52) U.S. Cl.
  CPC ............ *G06F 12/02* (2013.01); *G06F 12/023* (2013.01); *G06F 12/0864* (2013.01); *G11C 7/1072* (2013.01); *G06F 12/0897* (2013.01); *G06F 2212/205* (2013.01); *G06F 2212/304* (2013.01); *G11C 11/408* (2013.01)

(58) Field of Classification Search
  CPC .... G06F 12/02; G06F 12/023; G06F 12/0897; G11C 7/1072
  USPC .......................................... 711/105
  See application file for complete search history.

(56) References Cited

U.S. PATENT DOCUMENTS

| 5,680,570 | A  | * | 10/1997 | Rantala .................. G11C 29/74 |
|           |    |   |         |                             711/104 |
| 6,578,108 | B1 | * | 6/2003  | Fujimoto .............. G06F 3/0607 |
|           |    |   |         |                             711/114 |
| 6,611,855 | B1 |   | 8/2003  | Hellberg et al. |
| 6,721,796 | B1 |   | 4/2004  | Wong |

(Continued)

FOREIGN PATENT DOCUMENTS

| JP | 2005216053 | 8/2005 |
| JP | 2009037546 | 2/2009 |

(Continued)

OTHER PUBLICATIONS

Mobile Memory Wide I/O, JEDEC, Dec. 2011.*

*Primary Examiner* — Mark Giardino Jr
*Assistant Examiner* — Mohamed Gebril
(74) *Attorney, Agent, or Firm* — Ward and Smith, P.A.

(57) ABSTRACT

A method of managing dynamic memory reallocation includes receiving an input address including a block bit part, a tag part, and an index part and communicating the index part to a tag memory array, receiving a tag group communicated by the tag memory array based on the index part, analyzing the tag group based on the block bit part and the tag part and changing the block bit part and the tag part based on a result of the analysis, and outputting an output address including a changed block bit part, a changed tag part, and the index part.

19 Claims, 26 Drawing Sheets

(56) References Cited

U.S. PATENT DOCUMENTS

| | | | |
|---|---|---|---|
| 7,020,758 B2* | 3/2006 | Fisk | H04L 41/08 711/114 |
| 7,231,409 B1* | 6/2007 | Chen | G06F 11/1435 |
| 7,398,418 B2* | 7/2008 | Soran | G06F 3/0608 711/114 |
| 7,401,201 B2* | 7/2008 | Moyer | G06F 12/1027 711/207 |
| 7,434,002 B1* | 10/2008 | Zedlewski | G06F 11/3409 711/130 |
| 7,454,566 B1* | 11/2008 | Overby | G06F 3/0607 711/100 |
| 7,464,199 B2* | 12/2008 | Bissessur | G06F 13/28 710/22 |
| 7,657,706 B2 | 2/2010 | Iyer et al. | |
| 7,882,307 B1* | 2/2011 | Wentzlaff | G06F 12/0813 711/119 |
| 7,900,010 B2 | 3/2011 | Prasad et al. | |
| 7,908,455 B2 | 3/2011 | Palladino | |
| 7,953,024 B2 | 5/2011 | Mayhew et al. | |
| 7,962,715 B2* | 6/2011 | Ware | G06F 12/0292 711/112 |
| 7,971,025 B2* | 6/2011 | Murase | G06F 3/0607 711/161 |
| 8,010,764 B2 | 8/2011 | Keller, Jr. et al. | |
| 8,332,594 B2* | 12/2012 | Borntraeger | G06F 12/109 711/147 |
| 8,499,114 B1* | 7/2013 | Vincent | G06F 9/5077 711/147 |
| 8,533,403 B1* | 9/2013 | Law | G06F 13/1605 711/105 |
| 8,631,205 B1* | 1/2014 | Wentzlaff | G06F 12/0813 710/10 |
| 8,909,845 B1* | 12/2014 | Sobel | G06F 9/45558 711/154 |
| 8,996,837 B1* | 3/2015 | Bono | G06F 3/0614 711/114 |
| 9,280,469 B1* | 3/2016 | Kuang | G06F 12/0815 |
| 2005/0268067 A1* | 12/2005 | Lee | G06F 12/10 711/202 |
| 2006/0047908 A1* | 3/2006 | Chikusa | G06F 3/0613 711/114 |
| 2007/0156951 A1* | 7/2007 | Sultan | G06F 11/1044 711/103 |
| 2008/0010419 A1* | 1/2008 | Kao | G06F 13/1694 711/154 |
| 2008/0010420 A1* | 1/2008 | Kao | G06F 12/0223 711/154 |
| 2008/0010500 A1* | 1/2008 | Shimmitsu | G06F 11/1662 714/6.32 |
| 2008/0229045 A1* | 9/2008 | Qi | G06F 3/0605 711/170 |
| 2008/0263299 A1* | 10/2008 | Suzuki | G06F 11/1662 711/162 |
| 2009/0049264 A1* | 2/2009 | Resnick | G06F 12/0844 711/163 |
| 2009/0204872 A1* | 8/2009 | Yu | G06F 3/0613 714/773 |
| 2009/0240880 A1* | 9/2009 | Kawaguchi | G06F 3/0617 711/114 |
| 2010/0169401 A1* | 7/2010 | Gopal | G06F 7/02 708/316 |
| 2010/0281208 A1* | 11/2010 | Yang | G06F 3/0611 711/103 |
| 2010/0306174 A1* | 12/2010 | Otani | G06F 11/1464 707/640 |
| 2011/0082988 A1 | 4/2011 | Kono et al. | |
| 2011/0153917 A1 | 6/2011 | Maita et al. | |
| 2011/0185120 A1* | 7/2011 | Jess | G06F 3/061 711/114 |
| 2011/0252180 A1* | 10/2011 | Hendry | G06F 1/3203 711/3 |
| 2012/0110592 A1* | 5/2012 | Shah | G06F 9/5077 718/104 |
| 2013/0031327 A1* | 1/2013 | Chang | G06F 12/0811 711/170 |
| 2013/0124807 A1* | 5/2013 | Nielsen | G06F 11/1438 711/162 |
| 2014/0006684 A1* | 1/2014 | Ramakrishnan | G06F 12/16 711/102 |

FOREIGN PATENT DOCUMENTS

| | | |
|---|---|---|
| JP | 2009258925 | 11/2009 |
| JP | 2010231465 | 10/2010 |
| KR | 20070075769 | 7/2007 |
| KR | 20090058232 | 6/2009 |

* cited by examiner

FIG. 26A

| INDEXP | Way0(=00) | | Way1(=01) | | |
|---|---|---|---|---|---|
| | TAG | L | TAG | L | |
| 0 | 0 | (0) | - | 0 | ~TG1 |
| 1 | - | 0 | 3 | (1) | ~TG2 |

| INDEXP | Way0(=00) | | Way1(=01) | | |
|---|---|---|---|---|---|
| | TAG | L | TAG | L | |
| 0 | 0 | (1) | - | 0 | ~TG1 |
| 1 | - | 0 | 3 | (0) | ~TG2 |

METHOD OF MANAGING DYNAMIC MEMORY REALLOCATION AND DEVICE PERFORMING THE METHOD

CROSS-REFERENCE TO RELATED APPLICATIONS

This application claims priority under 35 U.S.C. §119(a) from Korean Patent Application No. 10-2012-0084768 filed on Aug. 2, 2012, the subject matter of which is hereby incorporated by reference.

BACKGROUND

Embodiments of the inventive concept relate to methods of managing dynamic memory reallocation. More particularly, certain embodiments of the inventive concept relate to methods of dynamically managing addresses corresponding to memory regions of a wide input/output (I/O) mobile dynamic random access memory (DRAM). Certain other embodiments of the inventive concept relate to methods of dynamically managing addresses corresponding to memory regions of a main memory. Still other embodiments of the inventive concept relate to devices capable of performing such methods.

The term "cache memory" is typically applied to high-speed memories designed operate in close conjunction with one or more processor(s) or similar computational component(s). Cache memory is commonly implemented using random access memory (RAM) that allows relatively fast data access. In contrast, the term "main memory" is typically applied to bulk storage memories that operate a relatively lower speeds.

When a read request directed to "read data" is received in a system, a processor may first determine whether the requested read data is stored in a cache memory. If the read data is identified in a cache memory, the processor need not access the main memory. However, if the read data is not found in a cache memory, the processor must then access the main memory to retrieve it.

Cache memories may be used in a variety of configurations. Consistent with hierarchal system definitions, a cache memory may be classified as a level-1 (L1) cache, a level-2 (L2) cache, and a level-3 (L3) cache, and so on. Generally speaking, a L1 cache is commonly integrated on a chip with one or more corresponding processor(s) to form a so-called "processor core" or "processor multi-core". In contrast, a L2 cache is typically disposed outside the processor core but may be integrated within a System on Chip (SoC) as a physically separate chip. In still further contrast, a L3 cache is typically disposed outside the SoC (e.g.,) on a motherboard. With this disposition, the L3 cache may serve as a buffer memory between the processor(s) and the main memory.

Memory space is a scarce commodity in computational systems. Memory space may be scarce as a function of time (i.e., temporally crowded or bottlenecked) or it may be scarce as a function of overall data storage demand. In either event, memory space must be effectively managed to ensure proper operation of a host device incorporating or accessing the memory. One approach to the effective management of memory space is referred to as "dynamic memory allocation." Dynamic memory allocation methods seek to efficiently allocate space in a main memory to the current requirements of one or more processor(s) reading data from and/or writing data (collectively or singularly "accessing data") to the main memory. As memory systems become expansive, and as computational systems become more complicated the need to effectively perform dynamic memory allocation increases.

SUMMARY

According to an aspect of the inventive concept, there is provided a method of managing dynamic memory reallocation. This method includes receiving an input address having a block bit part, a tag part, and an index part and communicating the index part to a tag memory array, receiving a tag group communicated by the tag memory array based on the index part, analyzing the tag group based on the block bit part and the tag part and changing the block bit part and the tag part based on a result of the analysis, and outputting an output address having a changed block bit part, a changed tag part, and the index part.

The block bit part determines whether bits included in the tag part are interpreted as first tag bits or first way bits.

According to one embodiment, when second tag bits included in a way part including an indication bit indicating that data is swapped between heterogeneous memories are identical with the first tag bits, the changing comprises changing the block bit part, and changing the first tag bits into second way bits that indicate the way part, and the way part is one of a plurality of way parts included in the tag group.

According to another embodiment, when second way bits included in a way part including an indication bit indicating that data is swapped between heterogeneous memories are identical with the first way bits, the changing comprises changing the block bit part, and changing the first way bits into second tag bits included in the way part, and the way part is one of a plurality of way parts included in the tag group.

The method may further include counting the number of times the input address is received, and setting the indication bit and the second tag bits included in the way part, based on a result of the counting.

According to another aspect of the inventive concept, there is provided a System on Chip (SoC) including a tag memory array that stores tag groups and communicates one of the tag groups based on an index part, and an address translator which receives an input address including a block bit part, a tag part, and the index part and communicates the index part to the tag memory array.

The address translator may be used to analyze the tag group based on the block bit part and the tag part, change the block bit part and the tag part based on a result of the analysis, and then output an output address that includes a changed block bit part, a changed tag part, and the index part.

In one embodiment, the address translator may include a selection circuit that outputs the output address or a swapped address based on a selection signal, and a latest address processing circuit which generates the selection signal based on a swap enable signal. The selection circuit outputs the swapped address output by the latest address processing circuit, when the swap enable signal is activated.

The SoC may further include a relocator that controls data swapping between heterogeneous memories in response to a relocation command and generates an update command according to a result of the control, and the address translator generates the relocation command including the input address and the output address necessary for the data swapping, and the tag memory array writes information for changing the input address into the output address to the tag group based on the update command.

According to another aspect of the inventive concept, there is provided a computational system including a first memory comprising first addressable memory regions, a second memory comprising second addressable memory regions, and a SoC. The SoC may include a processor that controls access operations with respect to the first memory and the second memory, and a memory remapper which manages addresses corresponding to a sum of the first addressable memory regions and the second addressable memory regions.

The first memory is a dynamic random access memory (DRAM), and the second memory is a so-called wide input/output (I/O) mobile DRAM.

The memory remapper comprises a tag memory array which stores tag groups and communicates one of the tag groups based on an index part, and an address translator which receives an input address including a block bit part, a tag part, and the index part and communicates the index part to the tag memory array.

The address translator may be used to analyze the tag group based on the block bit part and the tag part, changes the block bit part and the tag part based on a result of the analysis, and outputs an output address that includes a changed block bit part, a changed tag part, and the index part.

BRIEF DESCRIPTION OF THE DRAWINGS

FIGS. 26A and 26B are a conceptual diagram for describing a process of describing a method of setting a software-controlled relocation bit.

DETAILED DESCRIPTION

Certain embodiments of the inventive concept will now be described in some additional detail with reference to the accompanying drawings. The inventive concept may, however, be variously embodied and should not be construed as being limited to only the illustrated embodiments. Throughout the written description and drawings like reference numbers and labels refer to like or similar elements and features.

Figure 1:
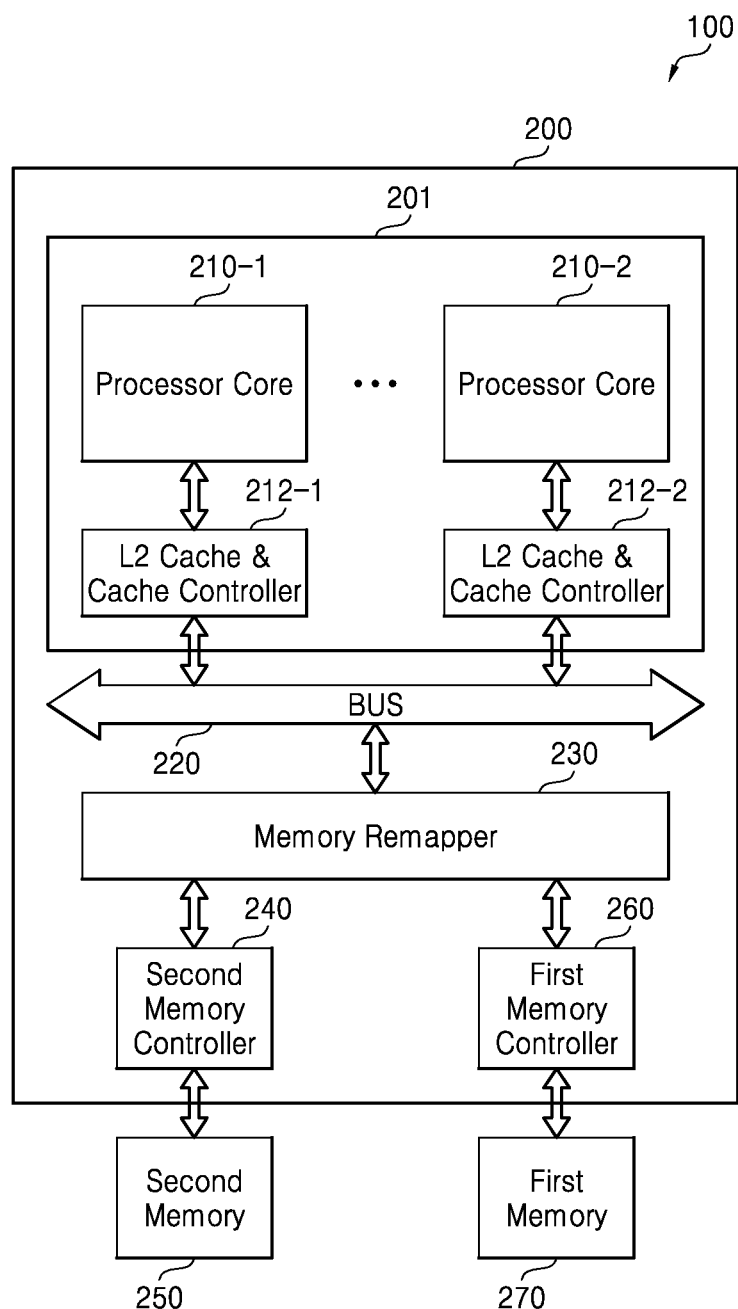
FIG. 1 is a block diagram of a computational system according to an embodiment of the inventive concept.

FIG. 1 is a block diagram of a computational system 100 according to an embodiment of the inventive concept. Referring to FIG. 1, the computational system 100 generally comprises a System on Chip (SoC) 200 and heterogeneous memories 250 and 270. In certain applications the SoC 200 may be used as a server.

The term "heterogeneous memory" is used to describe certain data storage components accessible by the SoC 200 that are configured to include two (2) or more different types of semiconductor memory (e.g., low-capacity and power efficient RAM, high-capacity or bulk discrete memory components such as memory modules, etc.). The term heterogeneous memory does not encompass non-semiconductor type memory components, such as hard disk drives.

The computational system 100 may be implemented to operate as a personal computer (PC), a server, or a portable electronic device. Possible portable electronic devices may include, as examples, a laptop computer, a mobile telephone, a smart phone, a tablet PC, a personal digital assistant (PDA), an enterprise digital assistant (EDA), a digital still camera, a digital video camera, a portable multimedia player (PMP), a personal (or portable) navigation device (PND), a handheld game console, or an e-book.

The heterogeneous memories 270 and 250 will hereafter be referred to as first and second memories 250 and 270, respectively. The first memory 270 is assumed to be implemented using a dynamic random access memory (DRAM), and the second memory 250 is assumed to be implemented using a wide input/output (I/O) mobile DRAM that supports the JEDEC JESD229 standard. In the illustrated embodiment of FIG. 1, it is further assumed that the first memory 270 functions as a main memory for the computational system 100 while the second memory 250 functions as a (L3) cache.

Hence, the second memory 250 is assumed to operate faster than the first memory 270, albeit the capacity and power consumption of the second memory 250 may be less than that of the first memory 270. Frequently accessed data may be stored in the second memory 250. The second memory 250 may be implemented as a vertically stacked memory component associated with the SoC 200.

The SoC 200 of FIG. 1 is assumed to include a multi-core processor 201, a bus 220, a memory remapper 230, a first memory controller 260, and a second memory controller 240.

Although FIG. 1 shows the bus 220 and the memory remapper 230 being disposed "external" to the multi-core processor 201, at least some portion of the bus 220 and possibly also (or alternatively) the memory remapper 230 may be integrated "internal" to the multi-core processor 201.

The multi-core processor 201 includes at least two (2) cores, namely, processor cores 210-1 and 210-2. It is assumed that the processor cores 210-1 and 210-2 may respectively communicate with the memory remapper 230 via separate L2 caches & cache controllers 212-1 and 212-2 and the bus 220.

The memory remapper 230 may be implemented in hardware using a circuit capable of facilitating a dynamic memory allocation management function, a dynamic memory reallocation management function, and/or an address management function.

Under the control of the multi-core processor 201, the memory remapper 230 may be used to control such operations as data swapping, data copying, and/or data movement of (e.g.,) "first data" stored in a "first memory region" of the first memory 270 and "second data" stored in a "second memory region" of the second memory 250. Here, it may be assumed that the first data is frequently accessed data.

During one or more of these operations—or in response to a data request, the memory remapper 230 may analyze a tag group provided by a tag memory array based on an index part included in an input address, tag bits (hereinafter, referred to as "first tag bits") included in a block bit part, and a tag part included in the input address. The memory remapper 230 may change the block bit part and the tag part based on analysis, and may then generate an output address that includes a changed block bit part, a changed tag part, and the index part.

The memory remapper 230 may also analyze a tag group provided by the tag memory array based on an index part of an input address, and on way bits (hereinafter, referred to as "first way bits") included in a block bit part and a tag part included in the input address. The memory remapper 230 may change the block bit part and the tag part based on the result of analysis, and may then generate an output address that includes a changed block bit part, a changed tag part, and the index part.

In other words, the memory remapper 230 may change an input address to an output address according to a definitional rules. Example of such definitional rules are set forth hereafter.

In certain embodiments, the block bit part may include one or more bits, while each of the tag part and the index part may include multiple bits.

The memory remapper 230 may communicate the output address to the first memory controller 260 and/or the second memory controller 240.

The first memory controller 260 may receive first access control signals (or commands) including the output address and control an access operation with respect to the first memory 270 based on the first access control signals. Similarly, the second memory controller 240 may receive second access control signals (or commands) including the output address and may control an access operation with respect to the second memory 250 based on the second access control signals. The first and/or second access control signals may include control signals such as addresses that are necessary to access an identified memory region of the first and second memory 270 or 250 during (e.g.,) a read/write operations.

Figure 2:
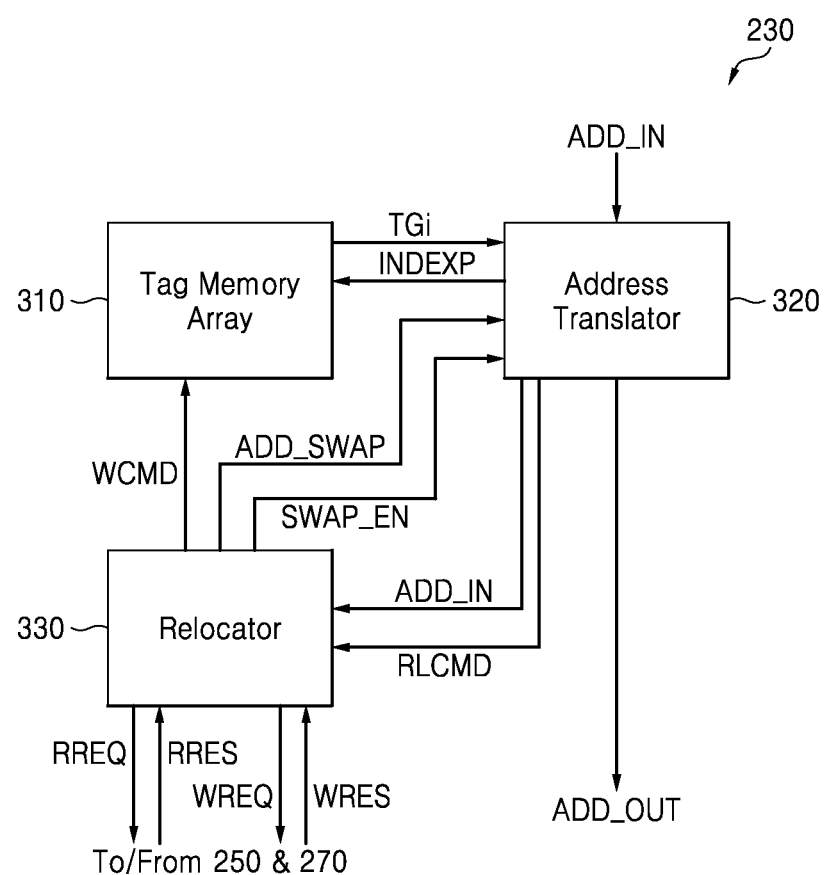
FIG. 2 is a block diagram of a memory remapper included in the computational system of FIG. 1.

FIG. 2 is a block diagram further illustrating the memory remapper 230 of FIG. 1. Referring to FIGS. 1 and 2, the memory remapper 230 comprises a tag memory array 310, an address translator 320, and a relocator 330.

The tag memory array 310 may be used to store a plurality of tag groups (or tag sets) or a plurality of tag contents. Each of the tag groups may change or update information used to change an input address ADD_IN into a corresponding output address ADD_OUT based on an update command WCMD. The tag memory array 310 may output a tag group TGi from among the tag groups to the address translator 320, based on an index part INDEXP received from the address translator 320.

Figure 3:
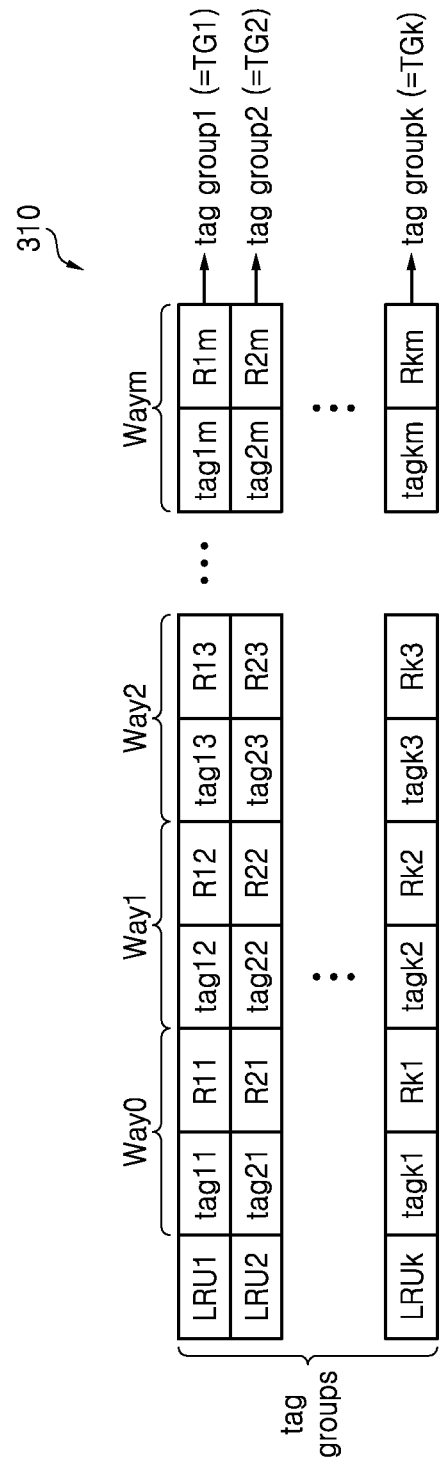
FIG. 3 illustrates a structure of a tag memory array included in the memory remapper of FIG. 2.

FIG. 3 is a conceptual diagram illustrating one possible structure for the tag memory array 310 of FIG. 2. Referring to FIG. 3, the tag memory array 310 includes a plurality of tag groups TG1 through TGk.

Each of the tag groups TG1 through TGk includes a corresponding one of least recently used (LRU) parts LRU1 through LRUk, and a plurality of way parts Way0 through Waym. The way parts Way0 through Waym include tag bit parts tagk1 through tagkm, respectively, and indication bit parts Rk1 through Rkm, respectively. Here, the variables "k" and "m" are natural numbers.

Each of the tag bit parts tagk1 through tagkm includes a plurality of bits (hereinafter, referred to as "second tag bits"), and each of the indication bit parts Rk1 through Rkm includes an indication bit. The indication bit includes a bit representing whether data is swapped, for example, one bit.

Each of the way parts Way0 through Waym is identified by way bits (hereinafter, referred to as "second way bits"). Each of the LRU parts LRU1 through LRUk includes information about a least recently accessed tag bit part. Each of the LRU parts LRU1 through LRUk may include (m−1) bits.

According to certain methods consistent with embodiments of the inventive concept, the address translator 320 may bypass the input address ADD_IN as the output address ADD_OUT, or may change the input address ADD_IN.

Figure 4:
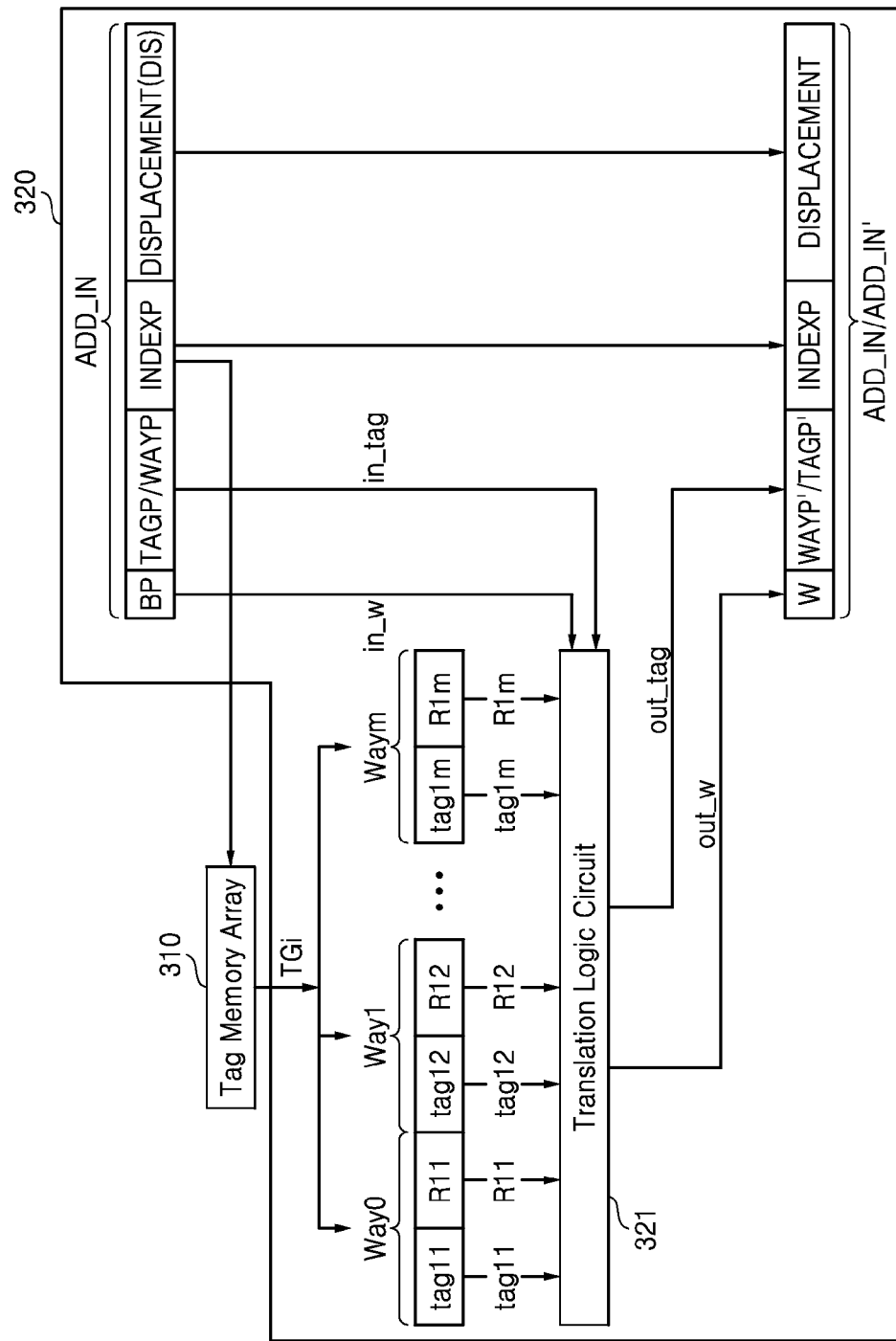
FIG. 4 is a conceptual diagram for explaining an operation of an address translator included in the memory remapper of FIG. 2.

FIG. 4 is a conceptual diagram further illustrating possible operation of the address translator 320 of FIG. 2. Referring collectively to FIGS. 1 to 4, the input address ADD_IN is assumed to include a block bit part BP, a tag part TAGP/WAYP, and an index part INDEXP. According to the illustrated embodiment, the input address ADD_IN further includes a displacement part DIS, wherein the displacement part DIS includes multiple bits.

The block bit part BP determines whether the bits included in the tag part TAGP/WAYP are interpreted as first tag bits TAGP, or as first way bits WAYP. The number of bits included in the block bit part BP may be defined as a function of the number of memories accessed by the SoC 200. For example, when the block bit part BP is "0", bits next to the block bit part BP may be interpreted as the first tag bits TAGP. On the other hand, when the block bit part BP is "1", the bits next to the block bit part BP may be interpreted as the first way bits WAYP.

In the illustrated example it is assumed that the index part INDEXP includes bits identifying each of the tag groups TG1 through TGk included in the tag memory array 310. For example, when the index part INDEXP includes X bits, the number of tag groups TG1 through TGk may be 2X.

The displacement part DIS represents an offset position within the first memory 270 or the second memory 250. For example, when a block size of 4 Kbytes is assumed, the width of the displacement part DIS may be 12 bits.

The address translator 320 may communicate the index part INDEXP included in the input address ADD_IN to the tag memory array 310.

The tag memory array 310 may communicate a tag group TGi (where 1≤I≤k) to the address translator 320 that is selected from the tag groups TG1 through TGk of FIG. 3 based on the index part INDEXP.

In the description that follows, it is assumed that the tag group TG1 or TG2 is communicated to the address translator 320 based on a bit value of the index part INDEXP.

A translation logic circuit 321 included in the address translator 320 may be used to receive a first tag group TG1, a block bit part BP=in_w, and a tag part TAGP/WAYP=in_tag, and may analyze the first tag group TG1 based on the block bit part BP=in_w and the tag part TAGP/WAYP=in_tag.

When the block bit part BP=in_w is "0", the translation logic circuit 321 will determine whether an indication bit of each of the indication bit parts R11 through R1m of the way parts Way0 through Waym is "1", and analyze whether the second tag bits of way parts each having an indication bit of "1" are identical with the first tag bits TAGP of the input address ADD_IN.

On the other hand, when the block bit part BP=in_w is "1", the translation logic circuit 321 will determine whether the indication bit of each of the indication bit parts R11 through R1m of the way parts Way0 through Waym is "1", and analyze whether the second way bits of way parts each having an indication bit of "1" are identical with the first way bits WAYP of the input address ADD_IN.

When it is determined that the block bit part BP=in_w and the first tag bits TAGP=in_tag need to be changed, the translation logic circuit 321 may change the block bit part BP=in_w and the first tag bits TAGP=in_tag, and outputs a translated address ADD_IN' including a changed block bit part out_w=W, changed first tag bits out_tag=WAYP', and the index part INDEXP. In other words, the first tag bits TAGP of the input address ADD_IN are changed to second way bits WAYP' that indicate a selected way part included in the selected tag group TG1.

When it is determined that the block bit part BP=in_w and the first way bits WAYP=in_tag need to be changed, the translation logic circuit 321 may change the block bit part BP=in_w and the first way bits WAYP=in_tag, and outputs a translated address ADD_IN' including the changed block bit part out_w=W, changed first way bits out_tag=TAGP', and the index part INDEXP. In other words, the first way bits WAYP of the input address ADD_IN are changed to second tag bits TAGP' included in the selected way part included in the selected tag group TG1.

On the other hand, when it is determined that the block bit part BP=in_w and the tag part TAGP/WAYP=in_tag do not need to be changed, the translation logic circuit 321 outputs a bypassed address ADD_IN including a bypassed block bit part out_w=W, a bypassed tag part out_tag=TAGP/WAYP, and the index part INDEXP, namely, the original input address ADD_IN.

Figure 5:
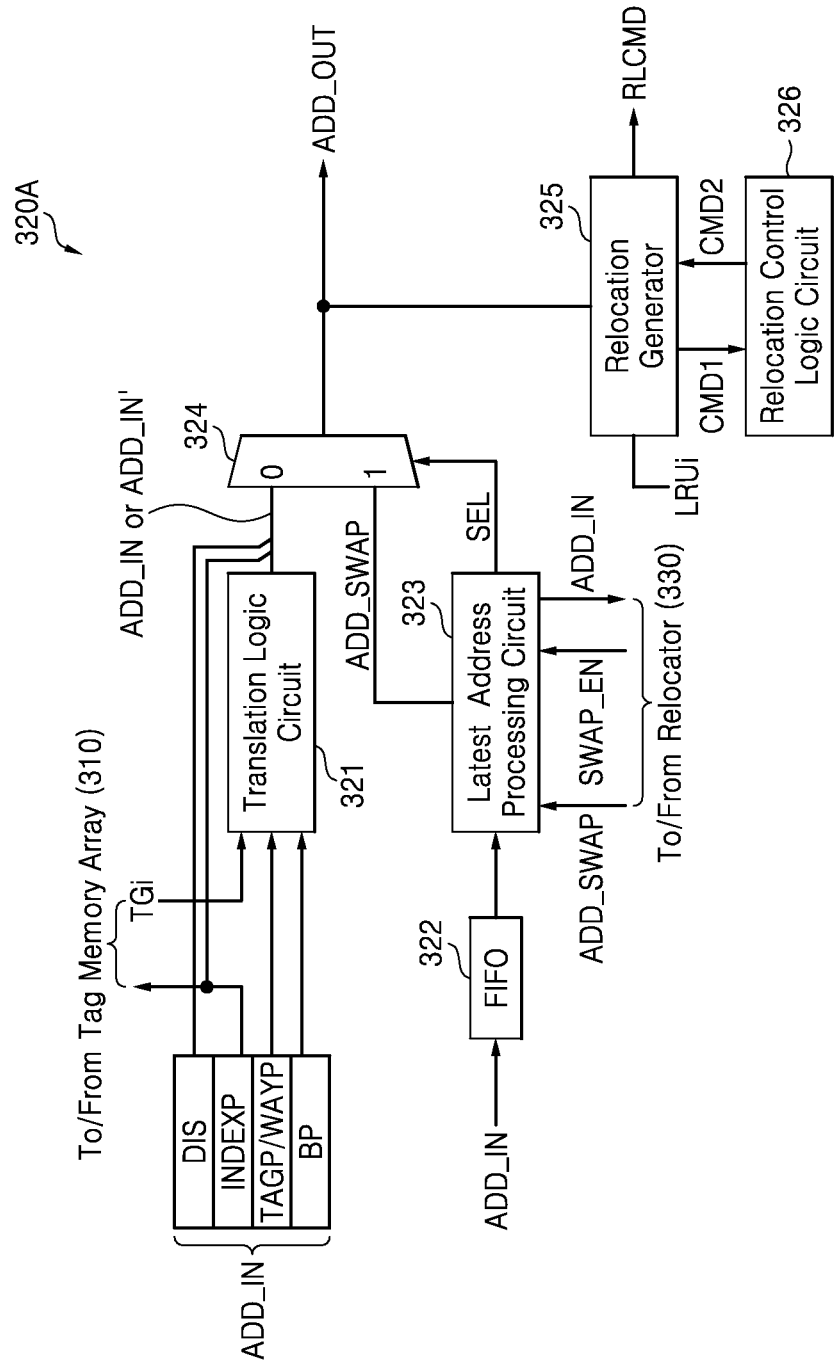
FIG. 5 is a block diagram of an embodiment of the address translator of the memory remapper of FIG. 2.

FIG. 5 is a block diagram of an address translator 320A, which is an embodiment of the address translator 320 of FIG. 2. Referring to FIG. 5, the address translator 320A may output (i) the bypassed address ADD_IN as the output address ADD_OUT, (ii) the translated address ADD_IN' as the output address ADD_OUT, or (iii) a swap address ADD_SWAP as the output address ADD_OUT when data swapping is performed, based on a selection signal SEL.

The address translator 320A of FIG. 5 includes a translation logic circuit 321, a first-in first-out (FIFO) 322, a latest address processing circuit 323, a selection circuit 324, a relocation generator 325, and a relocation control logic circuit 326.

As described above with reference to FIG. 4, the translation logic circuit 321 may be used to analyze the input address ADD_IN and output the bypassed address ADD_IN or the translated address ADD_IN' according to a result of the analysis.

The input address ADD_IN is communicated to the latest address processing circuit 323 via the FIFO 322. The latest address processing circuit 323 communicates the input address ADD_IN to the relocator 330. The latest address processing circuit 323 may be used to generate the selection signal SEL according a logical level of a swap enable signal WSAP_EN output by the relocator 330.

For example, when the swap enable signal WSAP_EN output by the relocator 330 is (e.g.,) logically "low", the latest address processing circuit 323 outputs a low selection signal SEL to the selection circuit 324. Accordingly, the selection circuit 324 may output the bypassed (or input) address ADD_IN or the translated address ADD_IN' received via a first input port 0, as the output address ADD_OUT.

On the other hand, when the swap enable signal WSAP_EN is logically "high", the latest address processing circuit 323 outputs the swap address ADD_SWAP, which is output by the relocator 330, and a high selection signal SEL to the selection circuit 324. Accordingly, the selection circuit 324 may output the swap address ADD_SWAP received via a second input port 1, as the output address ADD_OUT. In other words, when the swap enable signal WSAP_EN is activated, the latest address processing circuit 323 outputs the swap address ADD_SWAP to the selection circuit 324.

For example, while data swapping is being performed on the first data stored in the first memory region of the first memory 270 and the second data stored in the second memory region of the second memory 250, since information about the address of the first memory region and information about the address of the second memory region are not stored in a tag bit part of a specific way part of a specific tag group, the latest address processing circuit 323 may output the swap address ADD_SWAP output by the relocator 330 to the selection circuit 324.

For example, when a first address corresponds to the first memory region, a second address corresponds to the second memory region, and the first address is input as the input address ADD_IN, the latest address processing circuit 323 may output the second address as the swap address ADD_SWAP.

Accordingly, even during the data swapping, the address translator 320A may communicate the second address instead of the first address to each of the second and first memories 250 and 270. Accordingly, the multi-core processor 201 may control a read/write operations with respect to the second memory 250 instead of the first memory 270.

The relocation generator 325 may receive the bypassed, translated, or swapped address ADD_IN, ADD_IN', or ADD_SWAP for accessing the first memory 270 from the selection circuit 324, and may communicate a first command CMD1 including the received address, for example, bits TAGP, WAYP, TAGP', or WAYP' for accessing the first memory 270 (hereinafter, referred to as "first memory access bits") and the index part INDEXP to the relocation control logic circuit 326.

The relocation generator 325 may use an LRU part LRUi (where 1≤i≤k) in order to search for data on which data swapping is to be performed. The LRU part LRUi, which is output by the tag memory array 310, is information that represents which memory region has been accessed earliest, and may be referred to by the relocation generator 325 in order to generate a relocation command RLCMD.

Figure 6:
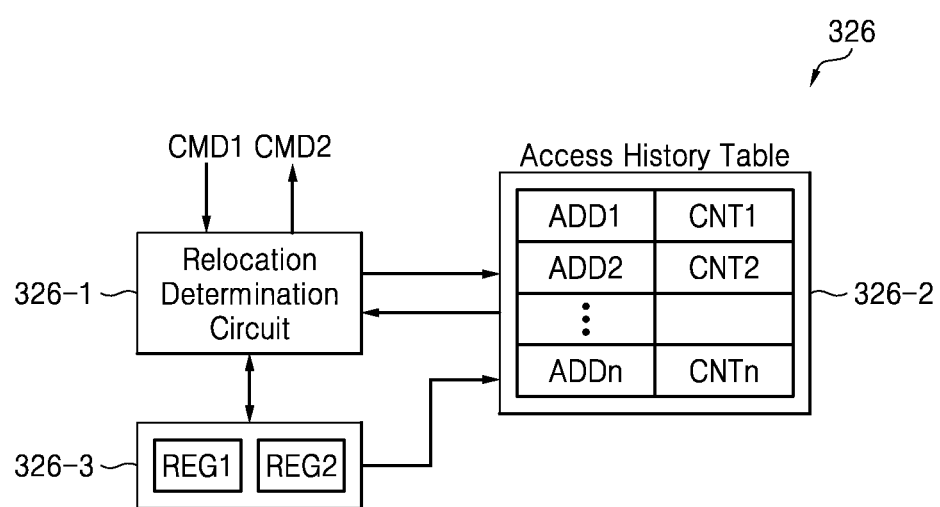
FIG. 6 is a block diagram of a relocation control logic circuit included in the address translator illustrated in FIG. 5.

FIG. 6 is a block diagram further illustrating the relocation control logic circuit 326 of in FIG. 5. The relocation control logic circuit 326 comprises a relocation determination circuit 326-1, an access history table 326-2, and a configuration register block 326-3.

The relocation determination circuit 326-1 is enabled in response to an enable signal included in the first command CMD1. The enabled relocation determination circuit 326-1 may search the access history table 326-2 by using the address that includes the first memory access bits and the index part INDEXP.

The access history table 326-2 may include a plurality of entries, each of which may include addresses ADD1 through ADDn and count values CNT1 through CNTn. Each of the addresses ADD1 through ADDn includes the first memory access bits and the index part INDEXP.

The access history table 326-2 stores the count values CNT1 through CNTn for the addresses ADD1 through ADDn, respectively. As a result of the search, when an address corresponding to the address that includes the first memory access bits and the index part INDEXP is stored in the access history table 326-2, the relocation determination circuit 326-1 increases the count value for the address by +1.

However, when an address corresponding to the address that includes the first memory access bits and the index part INDEXP is not stored in the access history table 326-2 and the address cannot be written to the access history table 326-2, the relocation determination circuit 326-1 may select an entry having the least count value, change an address included in the selected entry into the address, and set a count value included in the selected entry to "1".

On the other hand, when an address corresponding to the address including the first memory access bits and the index part INDEXP is not stored in the access history table 326-2 and the address can be written to the access history table 326-2, the relocation determination circuit 326-1 may select one entry from the entries, write the address to the selected entry, and set a count value included in the selected entry to "1".

After increasing the count value by +1, the relocation determination circuit 326-1 compares the increased count value with a reference count value stored in a first configuration register REG1 included in the configuration register block 326-3. When the increased count value is greater than or equal to the reference count value, the relocation determination circuit 326-1 communicates a second command CMD2 to the relocation generator 325.

After the second command CMD2 is communicated to the relocation generator 325, the relocation determination circuit 326-1 clears an entry including the increased count value.

The relocation determination circuit 326-1 may receive the address including the first memory access bits and the index part INDEXP, change a count value every time the address is received, and store the changed count value for the received address in the access history table 326-2.

The configuration register block 326-3 includes the first configuration register REG1 and a second configuration register REG2. The first configuration register REG1 stores the reference count value. The second configuration register REG2 stores an increment step or a decrement step for the count value. The increment step or the decrement step may be a natural number.

The reference count value, the increment step, or the decrement step may be programmed using the processor core 210-1 or 210-2. Alternatively, the reference count value, increment step, or decrement step may be programmed via a special device.

The relocation determination circuit 326-1 may access the configuration register block 326-3.

The relocation generator 325 of FIG. 5 may generate the relocation command RLCMD by using at least one of the second command CMD2 output by the relocation control logic circuit 326 and the LRU part LRUi, and may communicate the relocation command RLCMD to the relocator 330.

The relocation command RLCMD may include an enable signal, addresses necessary for data swapping (e.g., addresses for the memory regions of the first memory 270 and addresses for the memory regions of the second memory 250), and an indication signal that indicates a method of data swapping.

For example, when data swapping is to be performed as 2-way swapping, namely, an operation of swapping respective pieces of data stored in two memory regions, the relocation command RLCMD includes respective addresses corresponding to the two memory regions. 2-way swapping will be described hereafter with reference to FIGS. 10 and 11.

Alternatively, when the data swapping is to be performed as 3-way swapping, namely, an operation of swapping respective pieces of data stored in three memory regions, the relocation command RLCMD includes respective addresses corresponding to the three memory regions. 3-way swapping will be described hereafter with reference to FIGS. 10, 11, 12 and 13. For example, when the indication signal is one of "0" and "1", the memory remapper 230 may perform 2-way swapping, and, when the indication signal is the other, the memory remapper 230 may perform 3-way swapping.

Figure 7:
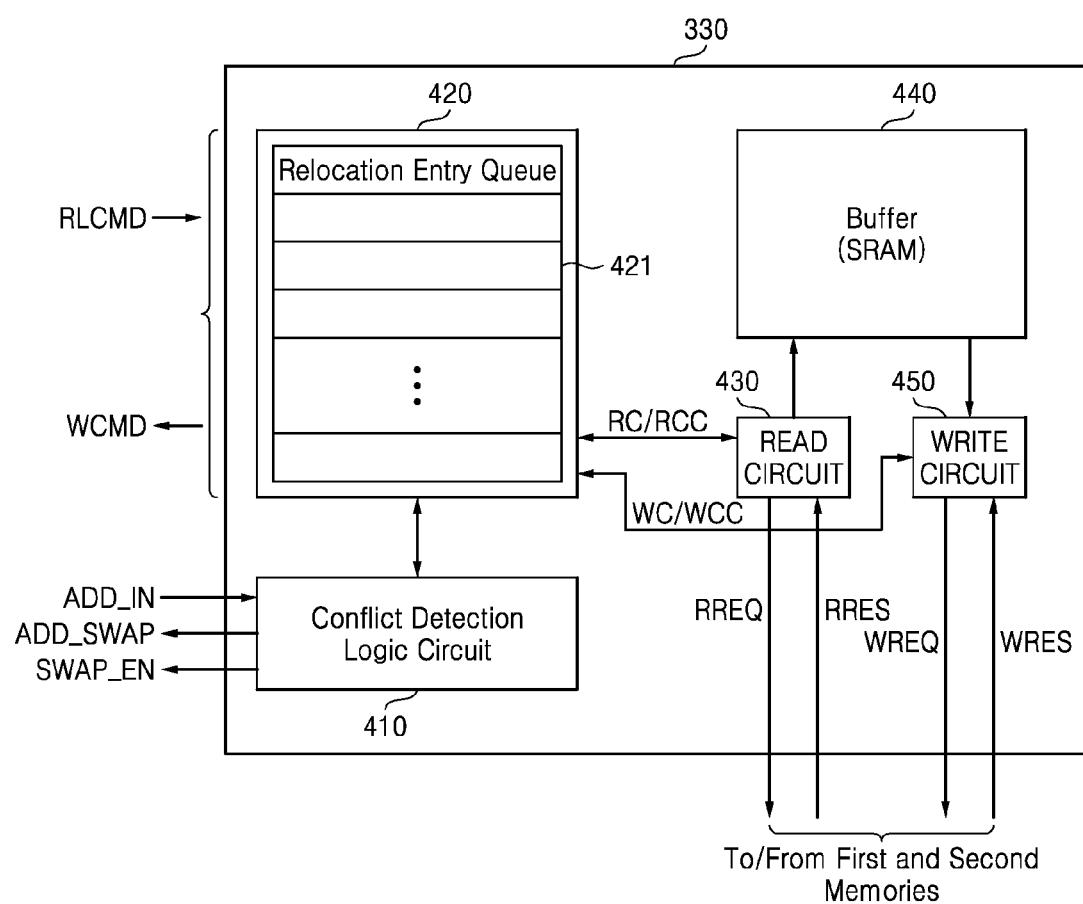
FIG. 7 is a block diagram of a relocator included in the memory remapper illustrated in FIG. 2.

FIG. 7 is a block diagram further illustrating the relocator 330 of FIG. 2. Referring to FIG. 7, the relocator 330 comprises a conflict detection logic circuit 410, a relocation entry queue 421 included in an interface 420, a read circuit 430, a buffer 440, and a write circuit 450. The interface 420 controls an operation of the relocation entry queue 421. For example, the relocation entry queue 421 is embodied outside of the interface 420. The interface may be a hardware component.

The conflict detection logic circuit 410 monitors the relocation entry queue 421 in order to check if data swapping is currently performed on the data stored in a memory region corresponding to the input address ADD_IN. The relocation entry queue 420 may store addresses necessary for data swapping.

When data swapping is currently performed on the data stored in the memory region corresponding to the input address ADD_IN, the conflict detection logic circuit 410 may output an address obtained after the data swapping is performed, for example, the swapped address ADD_SWAP, and the swap enable signal SWAP_EN, to the latest address processing circuit 323 of the address translator 320A.

The interface 420 may output a read command RC including the addresses necessary for data swapping, to the read circuit 430, based on the relocation command RLCMD.

The read circuit 430 may communicate a read request RREQ including the addresses necessary for data swapping to the second memory 250 and the first memory 270, based on the read command RC. The read circuit 430 may receive a read response RRES including the second data output by the second memory 250 and the first data output by the first memory 270, in response to the read request RREQ, and may write the first data and the second data to the buffer 440. After the write operation is completed, the read circuit 430 may communicate a read completion command RCC to the interface 420.

The buffer 440 may store data necessary for data swapping, namely, the first data and the second data. The buffer 440 may be implemented using a static random-access memory (SRAM).

The interface 420 may output a write command WC to the write circuit 450, based on the read completion command RCC.

The write circuit 450 may read the first data and the second data from the buffer 440 based on the write command WC, and then may communicate a write request WREQ including a command necessary for writing the first data to the second memory 250 and a command necessary for writing the second data to the first memory 270, to the second memory 250 and the first memory 270. The write circuit 450 may communicate a write completion command WCC to the inferface 420, based on a write response WRES.

The write response WRES may include a command indicating that writing of the first data to the second memory 250 has been completed, and a command indicating that writing of the second data to the first memory 270 has been completed.

The interface 420 may output the update command WCMD to the tag memory array 310, based on the write completion command WCC. The update command WCMD includes swapped addresses. Accordingly, the tag memory array 310 may update the tag bits of a tag bit part included in a corresponding tag group and the indication bit of an indication bit part included in the corresponding tag group, based on the update command WCMD.

Figure 8:
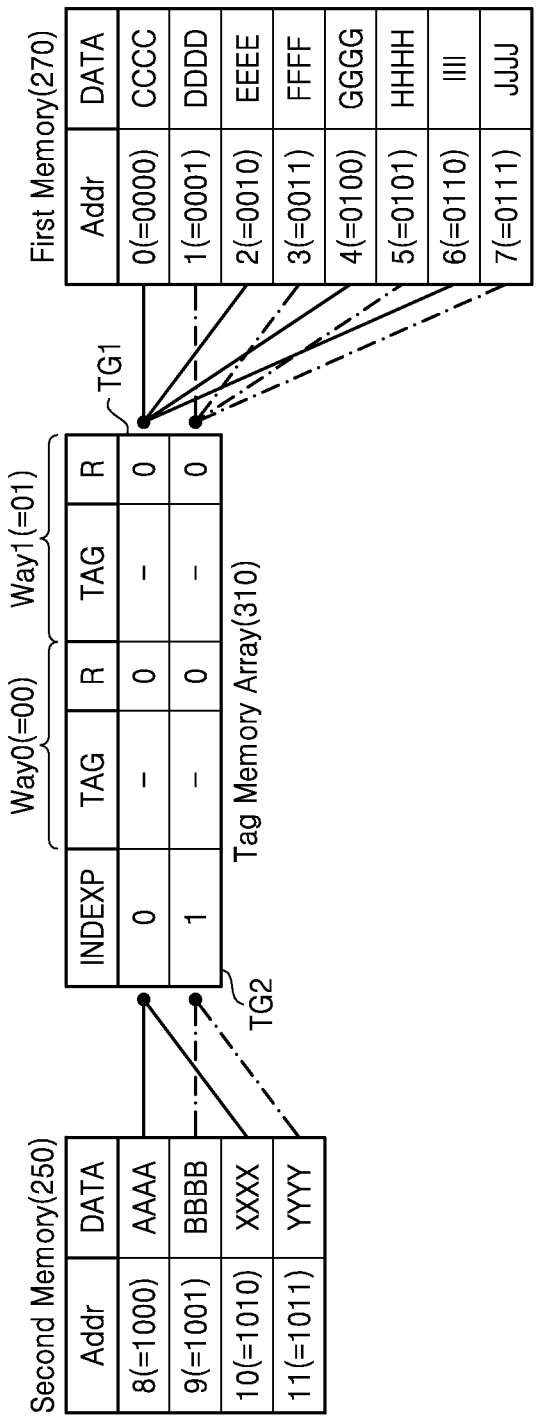
FIG. 8 illustrates data stored in the tag memory array of the memory remapper of FIG. 2 in an initial reset state.
Figure 9:
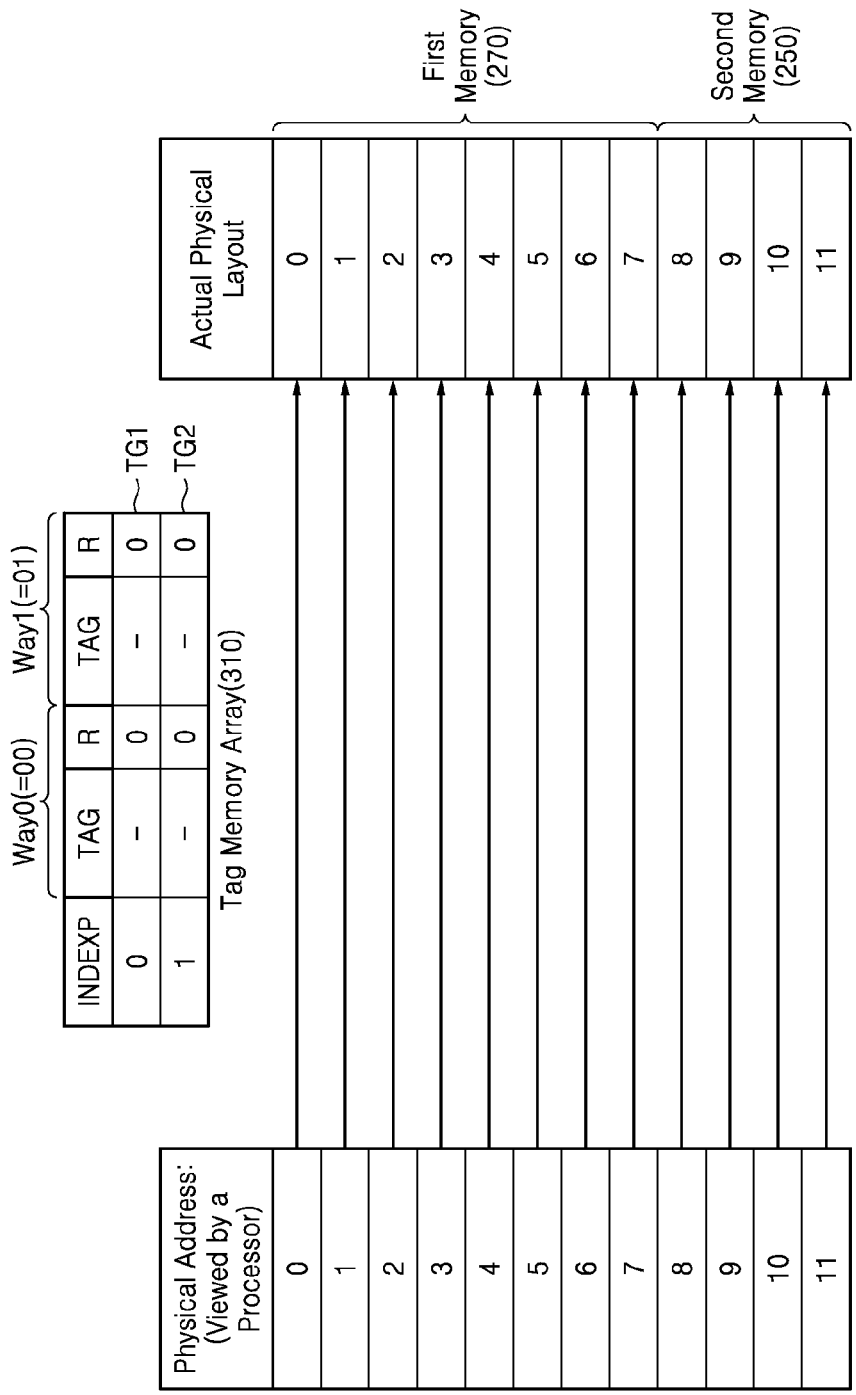
FIG. 9 is a memory map for explaining address mapping in the initial reset state of the tag memory array of FIG. 8.

FIG. 8 illustrates one example of data that may be stored in the tag memory array 310 in an initial reset state. FIG. 9 is a memory map illustrating one approach to address mapping when the tag memory array 310 is in the initial reset state of FIG. 8.

It is assumed that the first memory 270 includes 8 addressable memory regions Addr0 through Addr7, the second memory 250 includes 4 addressable memory regions Addr8 through Addr11, the tag memory array 310 includes 2 tag groups TG1 and TG2, and each of the two tag groups TG1 and TG2 includes 2 way parts Way0 and Way1.

Referring to FIGS. 3 and 8, for convenience of explanation, FIG. 8 does not illustrate LRU parts LRU1 and LRU2 and illustrates index parts INDEXP for respectively identifying the two tag groups TG1 through TG2.

In the initial reset state, an indication bit R of each of the tag groups TG1 and TG2 of the tag memory array 310 is initialized to "0". The second tag bits of each of the way parts Way0 and Way1 for each index part INDEXP may be set to be null.

As illustrated in FIG. 8, an index part INDEXP of "0" may indicate one of the memory regions Addr0, Addr2, Addr4, and Addr6 of the first memory 270, and an index part INDEXP of "1" may indicate one of the memory regions Addr1, Addr3, Addr5, and Addr7 of the first memory 270.

The index part INDEXP of "0" may also indicate one of the memory regions Addr8 and Addr10 of the second memory 250, and the index part INDEXP of "1" may also indicate one of the memory regions Addr9 and Addr11 of the second memory 250.

In view of the foregoing, memory remapper 230 may be used to manage 12 addresses corresponding to a sum of the 8 addressable memory regions Addr0 through Addr7 of the first memory 270 and the 4 addressable memory regions Addr8 through Addr11 of the second memory 250. For example, if the available memory space of "capacity" of the first memory 270 is 1 GByte and the capacity of the second memory 250 is 512 MByte, a processor operating within a conventional computational system according to a conventional memory management method will manages the 1 GByte memory space (and corresponding addresses) of the first memory 270.

However, the memory remapper 230 or multi-core processor 201 of the computational system 100 according to the embodiment of FIG. 1 may be used to manage the combined 1.5 GByte capacity (and the corresponding addresses) of the first memory 270 and second memory 250. In other words, the "visible capacity" seen by the conventional processor is 1 GByte, whereas the visible capacity of the multi-core processor 201 of the computational system 100 is 1.5 GByte.

Figure 10:
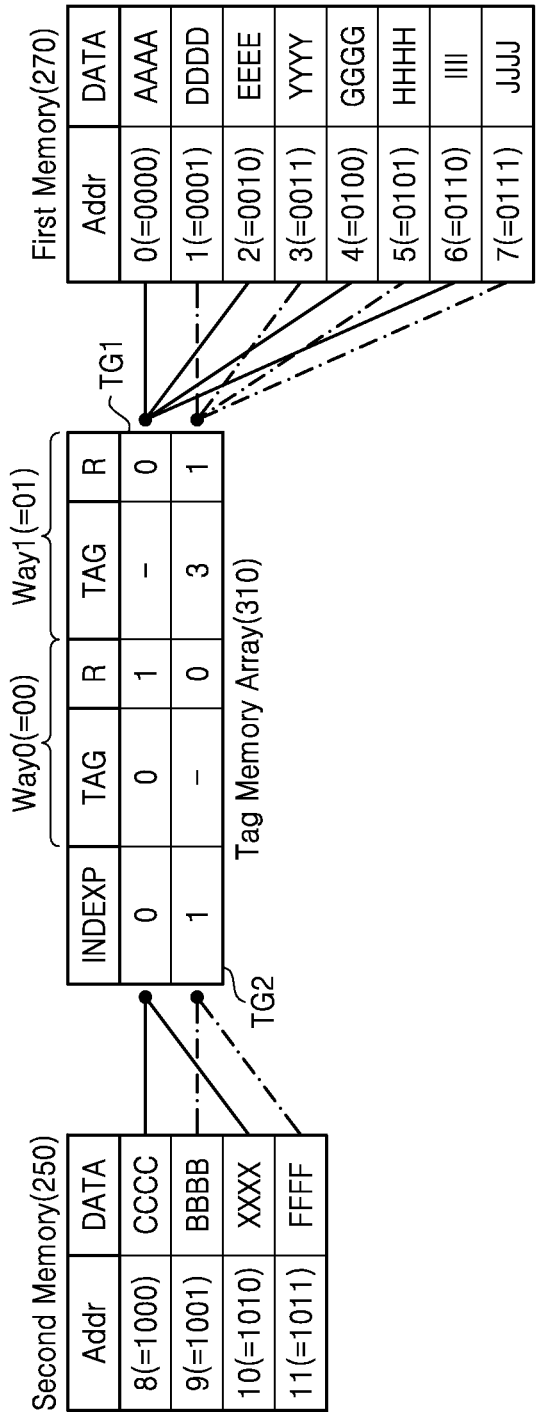
FIG. 10 illustrates data stored in the tag memory array of the memory remapper of FIG. 2 when data is swapped according to an embodiment of the inventive concept.

FIG. 10 illustrates data stored in the tag memory array 310 when data swapping has been performed according to an embodiment of the inventive concept. A case where data CCCC of a first memory region (i.e., a memory region corresponding to the address Addr0) of the first memory 270 and data AAAA of a first memory region (i.e., a memory region corresponding to the address Addr8) of the second memory 250 have been swapped with each other will now be described.

For convenience of explanation, it is assumed that an input address ADD_IN includes a block bit part BP, a tag part TAGP/WAYP, and an index part INDEXP. It is also assumed that a reference count value is a decimal number of 10. 4'b0000 represents a binary number of 0000, and 2'b00 represents a binary number of 00.

Referring to FIGS. 1 through 10, when the input address ADD_IN is "4'b0000", the block bit part BP of the input address ADD_IN=4'b0000 is "0". Accordingly, two bits of 00 included in the tag part TAGP/WAYP of the input address ADD_IN are the first tag bits TAGP, and the index part INDEXP is "0".

When the input address ADD_IN=4'b0000 is received, the address translator 320 communicates the index part INDEXP=0 to the tag memory array 310. The tag memory array 310 communicates the first tag group TG1 corresponding to the index part INDEXP=0 from among the two tag groups TG1 and TG2 of FIG. 9 to the translation logic circuit 321.

The translation logic circuit 321 receives the first tag group TG1, a block bit part BP=in_w=0, and first tag bits TAGP=in_tag=2'b00 and analyzes the first tag group TG1 based on the first tag bits TAGP=in_tag=2'b00. Since the indication bit R of each of the way parts Way0 and Way1 included in the first tag group TG1 of FIG. 9 is "0", the translation logic circuit 321 outputs a bypassed block bit part out_w=0 and bypassed first tag bits out_tag=2'b00.

The translation logic circuit 321 outputs a bypassed address ADD_IN=4'b0000 that includes a block bit part out_w=W=0, first tag bits out_tag=TAGP=2'b00, and the index part INDEXP=0. The input address ADD_IN=4'b0000 is communicated to the latest address processing circuit 323 via the FIFO 322.

The latest address processing circuit 323 communicates the input address ADD_IN=4'b0000 to the relocator 330. The conflict detection logic circuit 410 of the relocator 330 monitors the relocation entry queue 421. Since the input address ADD_IN=4'b0000 is an address on which data swapping is to be performed, the conflict detection logic circuit 410 communicates a low swap enable signal SWAP_EN to the latest address processing circuit 323.

The latest address processing circuit 323 communicates a low selection signal SEL to the selection circuit 324. Accordingly, the selection circuit 324 outputs the bypassed address ADD_IN=4'b0000 input via the first input port 0, as an output address ADD_OUT=4'b0000. Accordingly, the first memory controller 260 may access a memory region of the first memory 270 based on the output address ADD_OUT=4'b0000.

The relocation generator 325 outputs a first command CMD1 including an enable signal and the output address ADD_OUT=4'b0000 including the first tag bits TAGP=2'b00 and the index part INDEXP=0, to the relocation control logic circuit 326. The relocation determination circuit 326-1 sets the count value CNT1 corresponding to the address ADD1 to be 1 (i.e., one), based on the first command CMD1. Since the relocation determination circuit 326-1 does not generate the second command CMD2, the relocation generator 325 does not generate the relocation command RLCMD.

Until the input address ADD_OUT=4'b0000 is input 10 times, the bypass address ADD_OUT=4'b0000 is output as the output address ADD_OUT=4'b0000. When the input address ADD_OUT=4'b0000 is input 10 times, the relocation determination circuit 326-1 sequentially increases the count value CNT1 corresponding to the address ADD1 up to 10 (i.e., ten) based on the first command CMD1. In this case, since the relocation determination circuit 326-1 generates the second command CMD2, the relocation generator 325 generates the relocation command RLCMD.

The relocation command RLCMD includes the input address ADD_OUT=4'b0000 and a swapped address 4'b1000.

The interface 420 outputs a read command RC including the input address ADD_OUT=4'b0000 and the swapped address 4'b1000, to the read circuit 430. The read circuit 430 communicates the read request RREQ to the second memory 250 and the first memory 270, based on the read command RC.

The read circuit 430 writes the data CCCC stored in the first memory region corresponding to the input address ADD_OUT=4'b0000=Addr0 in the first memory 270 and the data AAAA stored in the first memory region corresponding to the swap address Addr8=4'b1000 in the second memory 250 to the buffer 440 based on a read response RRES including the data CCCC and the data AAAA, and communicates a read completion command RCC to the interface 420.

The interface 420 outputs the write command WC to the write circuit 450, based on the read completion command RCC.

The write circuit 450 reads the data CCCC and the data AAAA from the buffer 440 based on the write command WC, and then communicates a write request WREQ including a command necessary for writing the data AAAA to the first memory region of the first memory 270 and a command necessary for writing the data CCCC to the first memory region of the second memory 250, to the second memory 250 and the first memory 270.

The write circuit 450 outputs the write completion command WCC to the interface 420, based on a write response WRES including a write completion command output by the second memory 250 and a write completion command output by the first memory 270.

The interface 420 communicates an update command WCMD including addresses Addr0=4'b0000 and Addr8=4'b1000 to the tag memory array 310, based on the write completion command WCC.

The tag memory array 310 writes second tag bits, namely, "0(=2'b00)", to the tag bit part TAG of the first way part Way0 included in the first tag group TG1, and writes "1" to the indication bit R of the indication bit part, based on the update command WCMD.

Referring to FIGS. 1-7 and 10, when the input address ADD_IN=4'b0000 is received, the address translator 320 communicates the index part INDEXP=0 to the tag memory array 310. The tag memory array 310 communicates the first tag group TG1 corresponding to the index part INDEXP=0 from among the two tag groups TG1 and TG2 to the translation logic circuit 321.

The translation logic circuit 321 receives the first tag group TG1, the block bit part BP=in_w=0, and the first tag bits TAGP=in_tag=2'b00 and analyzes the first tag group TG1 based on the first tag bits TAGP=in_tag=2'b00.

Figure 11:
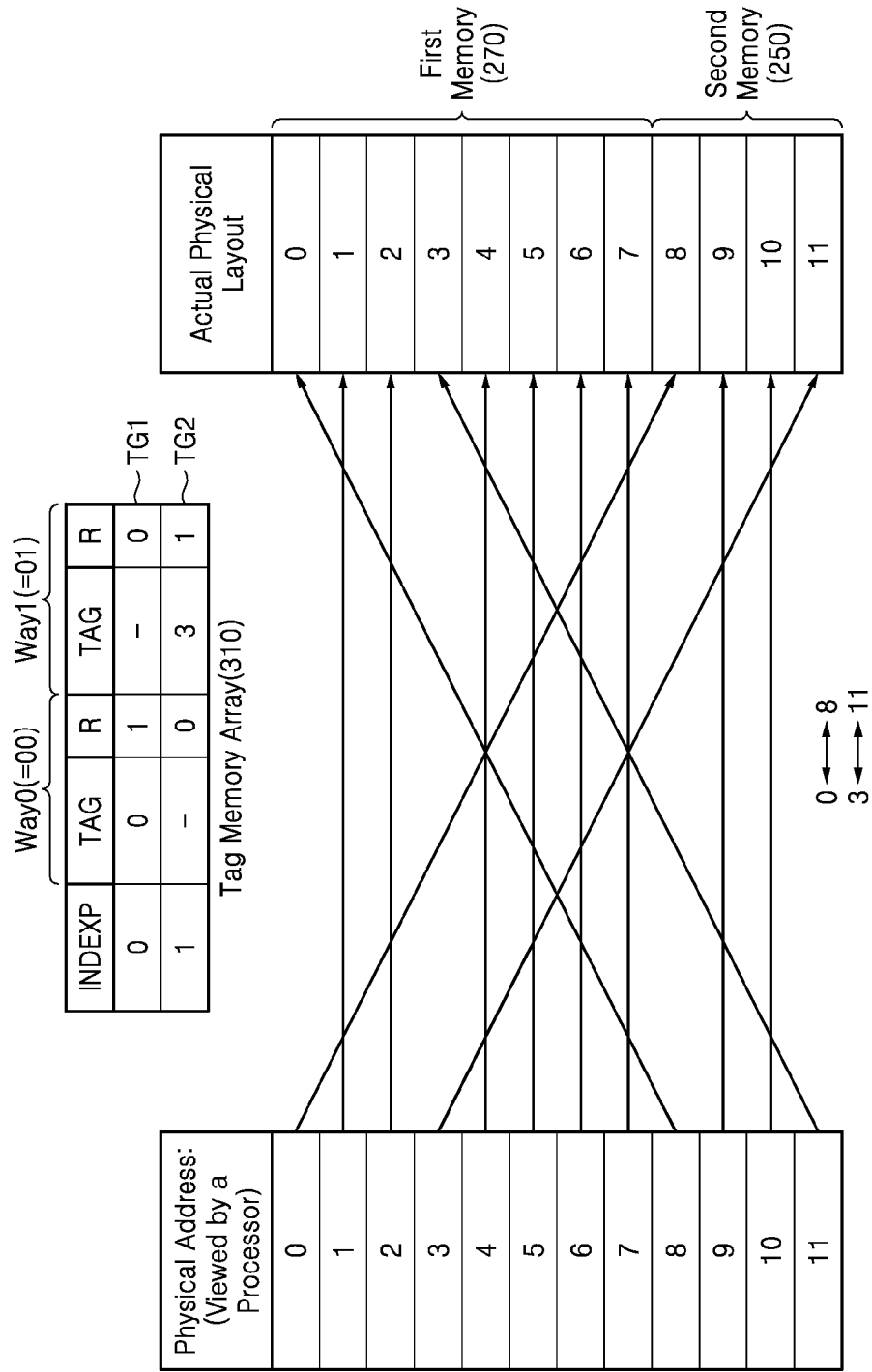
FIG. 11 is a memory map for explaining address mapping corresponding to the data stored in the tag memory array of FIG. 10.

The indication bit R of the first way part Way0 of the first tag group TG1 of FIG. 11 is "1", and the first tag bits TAGP=in_tag=2'b00 are identical with second tag bits 0=2'b00 included in the first way part Way0. Accordingly, the translation logic circuit 321 translates the block bit part BP from "0" to "1", translates the first tag bits TAGP=in_tag=2'b00 into the second way bits 2'b00, and outputs a translated block bit part out_w=1 and translated first tag bits out_tag=2'b00.

Since the first tag bits TAGP=in_tag=2'b00 are identical with the second way bits 2'b00, the translation of the first tag bits TAGP=in_tag=2'b00 into the second way bits 2'b00 is not strictly a "translation", but is described as a translation for convenience of explanation.

The translation logic circuit 321 outputs a translated address ADD_IN'=4'b1000 including the translated block bit part out_w=W=1, the translated first tag bits, namely, the second way bits out_tag=WAYP'=2'b00, and the index part INDEXP=0.

The selection circuit 324 outputs the translated address ADD_IN'=4'b1000 as the output address ADD_OUT, based on the low selection signal SEL. Accordingly, the multi-core processor 201 may access the data CCCC stored in the first memory region (namely, the memory region corresponding to Addr8) corresponding to the output address ADD_OUT=4'b1000 in the second memory 250, instead of accessing the first memory region (namely, the memory region corresponding to the address Addr0) corresponding to the input address ADD_IN=4'b0000 in the first memory 270.

Next, when an input address ADD_IN=4'b1000 is input, since a block bit part BP of the input address ADD_IN=4'b1000 is "1", a tag part TAGP/WAY of the input address ADD_IN=4'b1000 represents first way bits WAYP=2'b00.

The address translator 320 communicates an index part INDEXP=0 of the input address ADD_IN=4'b1000 to the tag memory array 310. The tag memory array 310 communicates the first tag group TG1 corresponding to the index part INDEXP=0 to the translation logic circuit 321.

The translation logic circuit 321 receives the first tag group TG1, the block bit part BP=in_w=1, and the first way bits WAYP=in_tag=2'b00 and analyzes the first tag group TG1 based on the first way bits WAYP=in_tag=2'b00.

The indication bit R of the first way part Way0 of the first tag group TG1 illustrated in FIG. 11 is "1", and the first way bits WAYP=in_tag=2'b00 are identical with the second way bits 0=2'b00.

Accordingly, the translation logic circuit 321 translates the block bit part BP from "1" to "0", translates the first way bits 2'b00 into the second tag bits 2'b00, and outputs a translated block bit part out_w=W=0 and translated first way bits, namely, the second tag bits out_tag=TAGP'=2'b00.

Accordingly, the translation logic circuit 321 outputs a translated address ADD_IN'=4'b0000 including the translated block bit part out_w=W=0 (ok?), the translated first way bits, namely, the second tag bits out_tag=TAGP'=2'b00, and the index part INDEXP=0.

The selection circuit 324 outputs the translated address ADD_IN=4'b0000 as the output address ADD_OUT, based on the low selection signal SEL. Accordingly, the multi-core processor 201 may access the data AAAA stored in the first memory region (namely, the memory region corresponding to the address Addr0) corresponding to the output address ADD_IN=4'b0000 in the first memory 270, instead of accessing the first memory region (namely, the memory region corresponding to the address Addr8) corresponding to the input address ADD_IN=4'b1000 in the second memory 250.

As described above, when the data CCCC stored in the first memory region corresponding to the address Addr0=4'b0000 and the data AAAA stored in the first memory region corresponding to the address Addr8=4'b1000, the address translator 320 translates the input data ADD_IN=4'b0000 and outputs the output address ADD_OUT=4'b1000 according to a result of the translation. Accordingly, the data CCCC stored in the first memory region of the second memory 250 may be accessed.

According to another embodiment, a case where data YYYY stored in a memory region corresponding to an address Addr=4'b1011 in the second memory 250 and data FFFF stored in a memory region corresponding to an address Addr=4'b0011 in the first memory 270 are swapped with each other will now be described.

FIG. 9 is a memory map that may be obtained before data swapping, and FIG. 11 is a memory map that may be obtained after data swapping. When an input address ADD_IN=4'b0011 is received, the address translator 320 communicates an index part INDEXP=1 to the tag memory array 310.

The tag memory array 310 communicates the second tag group TG2 corresponding to the index part INDEXP=1 to the translation logic circuit 321. The translation logic circuit 321 receives the second tag group TG2, the block bit part BP=in_w=0, and first tag bits TAGP=in_tag=2'b01 and analyzes the second tag group TG2 based on the first tag bits TAGP=in_tag=2'b01.

The indication bit R of the second way part Way1 of the second tag group TG2 of FIG. 11 is "1", and the first tag bits TAGP=in_tag=2'b01 are identical with second tag bits 3=2'b01 included in the second way part Way1.

A decimal number "1" may be expressed as a binary number "3'b001", a decimal number "3" may be expressed as a binary number "3'b011", a decimal number "5" may be expressed as a binary number "3'b101", and a decimal number "7" may be expressed as a binary number "3'b111". However, when the index part INDEXP=1 is considered as a Least Significant Bit (LSB), "3" may be expressed as "2'b01", "5" may be expressed as "2'b10", and "7" may be expressed as "2'b11".

The translation logic circuit 321 translates the block bit part BP from "0" to "1", translates the first tag bits 2'b01 into second way bits out_tag=WAYP'=2'b01, and outputs a translated block bit part out_w=W=1 and translated first tag bits, namely, the second way bits out_tag=WAYP'=2'b01.

The translation logic circuit 321 outputs a translated address ADD_IN'=4'b1011 including the translated block bit part out_w=W=1, the translated first tag bits out_tag=WAYP'=2'b01, and the index part INDEXP=1.

The selection circuit 324 outputs the translated address ADD_IN'=4'b1011 as the output address ADD_OUT, based on the low selection signal SEL.

The data FFFF stored in a fourth memory region (i.e., a memory region corresponding to the address Addr3) corresponding to the output address ADD_OUT=4'b1011 in the second memory 250 is accessed.

On the other hand, when an input address ADD_IN=4'b1011 is received, the address translator 320 communicates the index part INDEXP=1 to the tag memory array 310. The tag memory array 310 communicates the second tag group TG2 to the translation logic circuit 321, according to the index part INDEXP=1. The translation logic circuit 321 receives the second tag group TG2, the block bit part BP=in_w=1, and first way bits WAYP=in_tag=2'b01 and analyzes the second tag group TG2 based on the first way bits WAYP=in_tag=2'b01.

The indication bit R of the second way part Way1 of the second tag group TG2 illustrated in FIG. 11 is "1", and the first way bits 2'b01 are identical with the second way bits 2'b01 included in the second way part Way1.

Accordingly, the translation logic circuit 321 translates the block bit part BP from "1" to "0", translates the first way bits WAYP=in_tag=2'b01 into the second tag bits 3=2'b01, and outputs a translated block bit part out_w=W=0 and translated first way bits, namely, the second tag bits out_tag=TAGP'=2'b01. As described above, the second tag bits "2'b01" are expressed as "3".

The translation logic circuit 321 outputs a translated address ADD_IN'=4'b0011 including the translated block bit part out_w=W=0, the translated first way bits out_tag=TAGP'=2'b01, and the index part INDEXP=1.

The selection circuit 324 outputs the translated address ADD_IN'=4'b0011 as the output address ADD_OUT in response to the low selection signal SEL. The data YYYY stored in the fourth memory region corresponding to the output address ADD_OUT=4'b0011 in the first memory 250 may be accessed.

FIG. 11 is a memory map further illustrating address mapping corresponding to the data stored in the tag memory array 310 of FIG. 10. As shown in FIGS. 10 and 11, the memory remapper 230 may perform 2-way swapping.

As described above with reference to FIGS. 8 and 9, in view of the memory remapper 230, the memory remapper 230 may manage a total of 12 addresses corresponding to a sum of the 8 addressable memory regions Addr0 through Addr7 of the first memory 270 and the 4 addressable memory regions Addr8 through Addr11 of the second memory 250.

Figure 12:
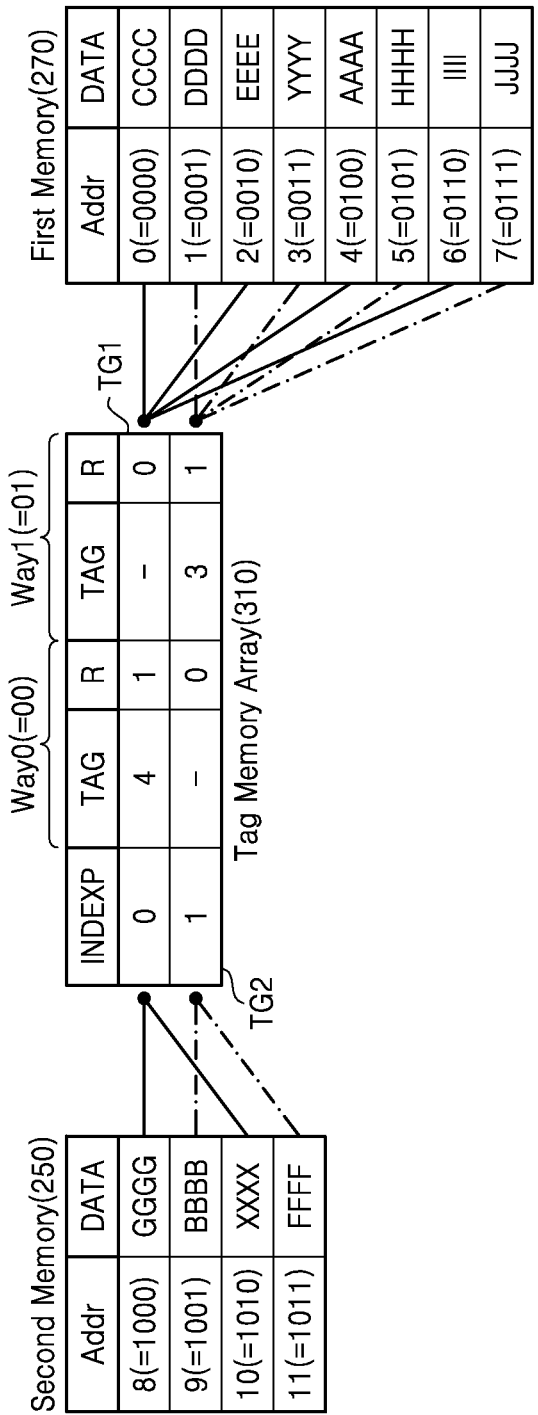
FIG. 12 illustrates data stored the tag memory array of the memory remapper of FIG. 2 when data is swapped according to another embodiment of the inventive concept.

FIG. 12 illustrates data that may be stored in the tag memory array 310 when data swapping has been performed according to another embodiment of the inventive concept.

Referring to FIGS. 10 and 12, according to 3-way swapping, data CCCC stored in the first memory region (i.e., the memory region corresponding to the address Addr8) of the second memory 250 is copied into (or moved to) the first memory region (i.e., the memory region corresponding to the address Addr0) of the second memory 270, the data AAAA stored in the first memory region of the first memory 270 is copied into a fifth memory region (i.e., a memory region corresponding to the address Addr4) of the first memory 270, and data GGGG stored in the fifth memory region of the first memory 270 is copied into the first memory region of the second memory 250.

When an input address ADD_IN=4'b0100 is received, the address translator 320 communicates the index part INDEXP=0 to the tag memory array 310. The tag memory array 310 communicates the first tag group TG1 corresponding to the index part INDEXP=0 from among the two tag groups TG1 and TG2 illustrated in FIG. 13 to the translation logic circuit 321.

The translation logic circuit 321 receives the first tag group TG1, the block bit part BP=in_w=0, and first tag bits TAGP=in_tag=2'b10 and analyzes the first tag group TG1 based on the first tag bits TAGP=in_tag=2'b10.

Figure 13:
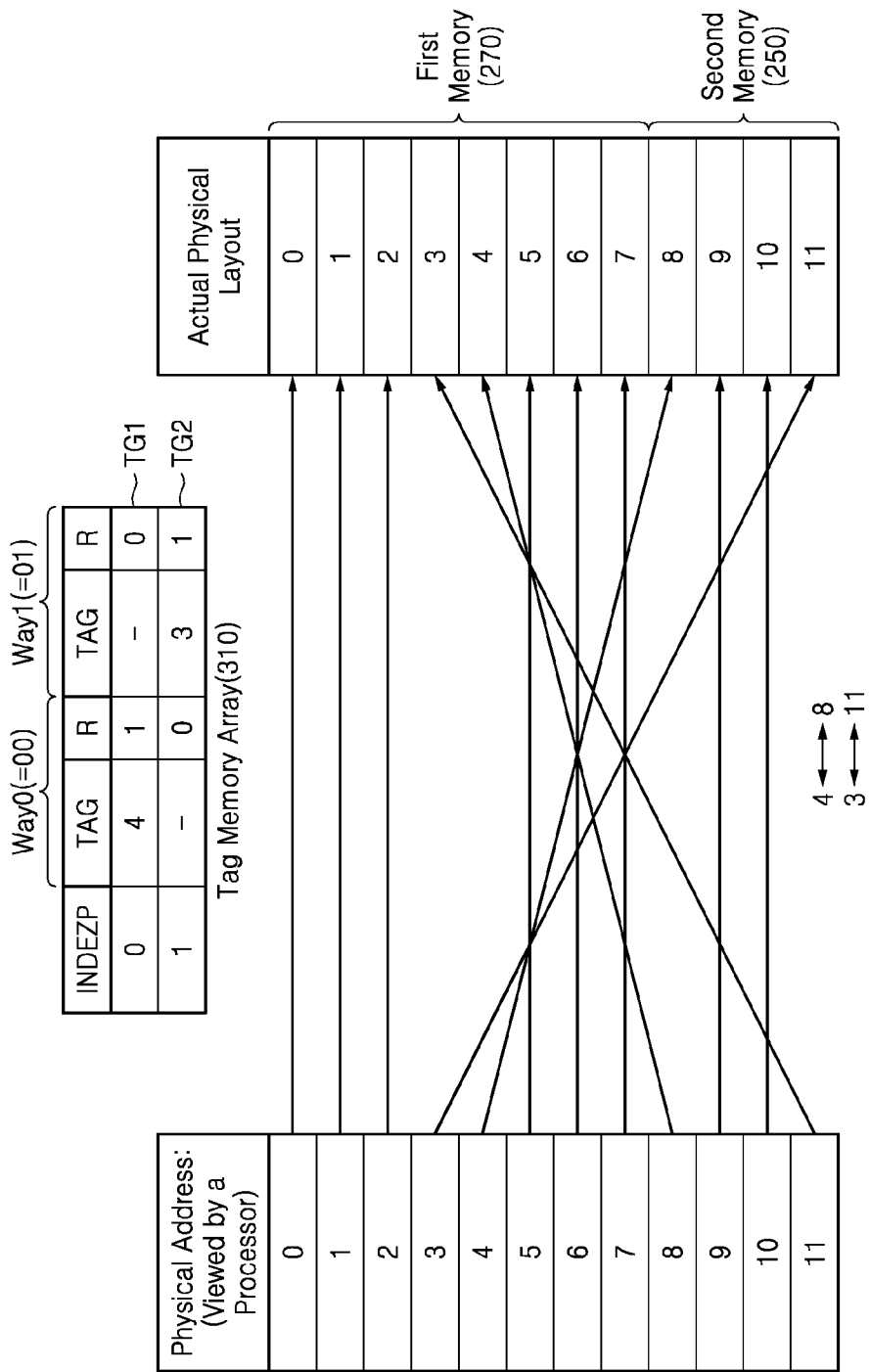
FIG. 13 is a memory map for explaining address mapping corresponding to the data stored in the tag memory array of FIG. 12.

The indication bit R of the first way part Way0 of the first tag group TG1 of FIG. 13 is "1", and the first tag bits TAGP=in_tag=2'b10 are identical with second tag bits 4=2'b10 included in the first way part Way0. In the manner as described above, the translation logic circuit 321 outputs a translated address ADD_IN'=4'b1000.

A decimal number "0" may be expressed as a binary number "3'b000", a decimal number "2" may be expressed as a binary number "3'b010", a decimal number "4" may be expressed as a binary number "3'b100", and a decimal number "6" may be expressed as a binary number "3'b110". However, when the index part INDEXP=0 is an LSB, for example, "2" may be expressed as "2'b01", "4" may be expressed as "2'b10", and "6" may be expressed as "2'b11".

The selection circuit 324 outputs the translated address ADD_IN'=4'b1000 as the output address ADD_OUT, based on the low selection signal SEL. Accordingly, the data GGGG stored in the first memory region corresponding to the output address ADD_OUT=4'b1000 in the second memory 250 may be accessed.

In contrast, when the input address ADD_IN=4'b1000 is received, the address translator 320 communicates the index part INDEXP=0 to the tag memory array 310. The tag memory array 310 communicates the first tag group TG1 corresponding to the index part INDEXP=0 from among the two tag groups TG1 and TG2 illustrated in FIG. 13 to the translation logic circuit 321.

The translation logic circuit 321 receives the first tag group TG1, the block bit part BP=in_w=1, and the first way bits WAYP=in_tag=2'b00 and analyzes the first tag group TG1 based on the first way bits WAYP=in_tag=2'b00.

The indication bit R of the first way part Way0 of the first tag group TG1 illustrated in FIG. 13 is "1", and the first way bits WAYP=in_tag=2'b00 are identical with the second way bits 2'b00 indicating the first way part Way0. Accordingly, the translation logic circuit 321 outputs a translated address ADD_IN'=4'b0100.

Since the selection circuit 324 outputs the translated address ADD_IN'=4'b0100 as the output address ADD_OUT, based on the low selection signal SEL, the data AAAA stored in the fifth memory region corresponding to the output address ADD_OUT=4'b0100 of the first memory 270 may be accessed.

FIG. 13 is a memory map further illustrating address mapping corresponding to the data stored in the tag memory array 310 of FIG. 12. As described above with reference to FIGS. 8 and 9, in view of the memory remapper 230, the memory remapper 230 may manage a total of 12 addresses corresponding to a sum of the 8 addressable memory regions Addr0 through Addr7 of the first memory 270 and the 4 addressable memory regions Addr8 through Addr11 of the second memory 250.

Figure 14:
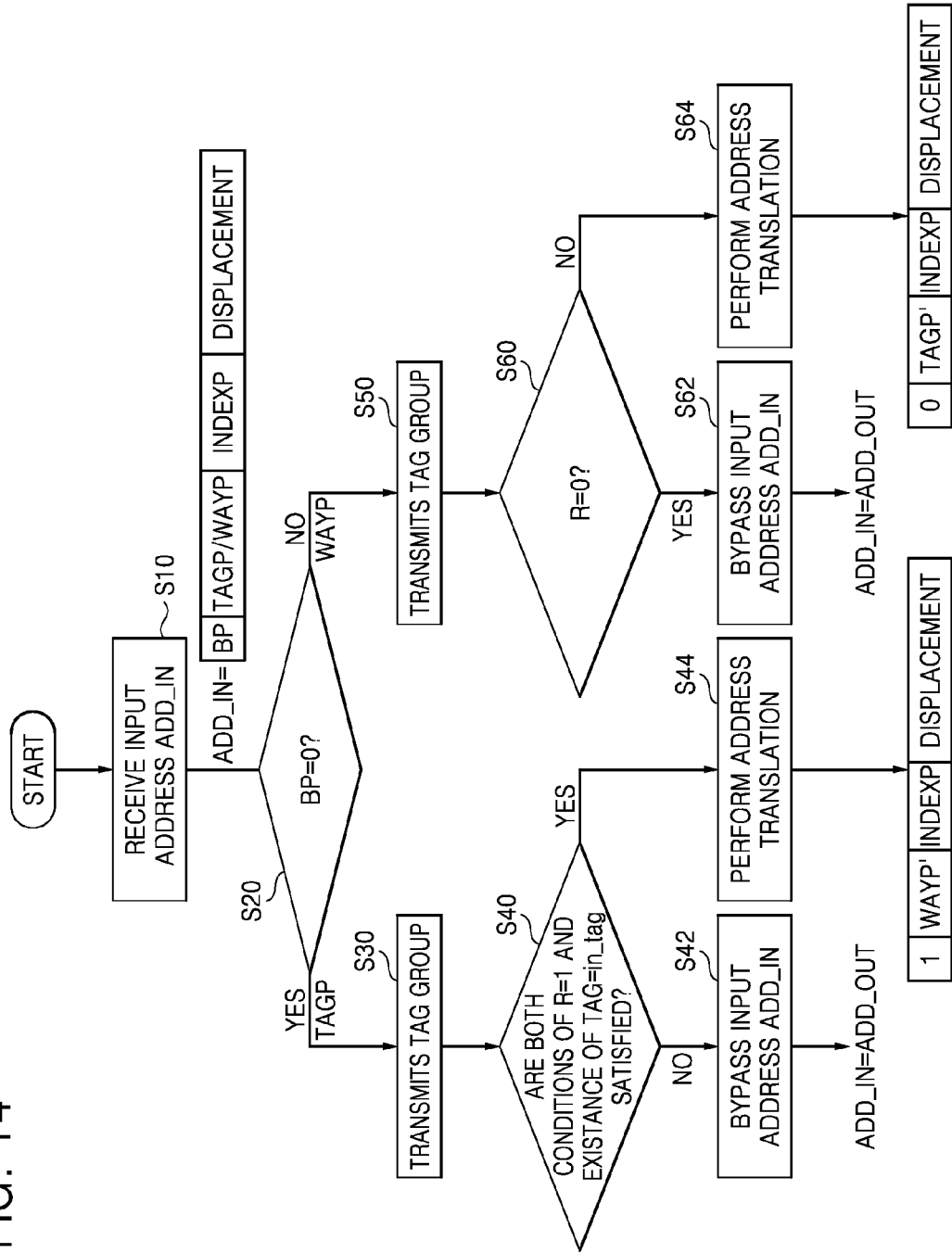
FIG. 14 is a flowchart of an operation of the address translator of the memory remapper of FIG. 2.

FIG. 14 is a flowchart summarizing one possible method of operation for the address translator 320 of FIG. 2. Referring to FIGS. 1-14, the method begins when the address translator 320 receives the input address ADD_IN (S10) and then communicates the index part INDEXP of the input address ADD_IN to the tag memory array 310.

Next, a determination is made as to whether the block bit part BP is "0" (S20). If the block bit part is "0" (S20=YES), then the bits included in the tag part TAGP/WAYP are interpreted as the first tag bits TAGP by the translation logic circuit 321. Alternatively, if the block bit part is "1" (S20=NO), then the bits included in the tag part TAGP/WAYP are interpreted as the first way bits WAYP by the translation logic circuit 321.

When it is determined that the block bit part BP is "0", the tag memory array 310 communicates (or "transmits" in certain embodiments) the tag group TGi selected from the tag groups TG1 through TGk based on the index part INDEXP to the address translator 320 (S30). Then, the translation logic circuit 321 will analyze the tag group TGi based on the block bit part BP and the first tag bits TAGP (S40).

When the indication bits R of the way parts of the tag group TGi are "1" and second tag bits of a tag bit part TAG of a way part including the indication bit R are not identical with the first tag bits TAGP=in_tag included in the input address ADD_IN in operation S40, the translation logic circuit 321 bypasses the input address ADD_IN (S42). Accordingly, the address translator 320 will output the input address ADD_IN as the output address ADD_OUT.

On the other hand, when the indication bits R of the way parts of the tag group TGi are "1" and the second tag bits of a tag bit part TAG of a way part including the indication bit R are identical with the first tag bits TAGP=in_tag included in the input address ADD_IN, the translation logic circuit 321 changes the block bit part BP and the first tag bits TAGP and outputs the input address ADD_IN' including the changed block bit part out_w=W and the changed first tag bits out_tag=WAYP, and the index part INDEXP (S44). The changed first tag bits out_tag=WAYP may be second way bits. Accordingly, the address translator 320 will output the input address ADD_IN' as the output address ADD_OUT.

As noted above, when it is determined that the block bit part BP is "1" (S20=NO), the tag memory array 310 communicates the tag group TGi to the address translator 320 based on the index part INDEXP of the input address ADD_IN (S50).

The translation logic circuit 321 analyzes the tag group TGi based on the block bit part BP and the first way bits WAYP (S60). When it is determined that the indication bits R of the way parts of the tag group TGi are "0" (S60=YES), the translation logic circuit 321 bypasses the input address ADD_IN (S62). Accordingly, the address translator 320 may output the input address ADD_IN as the output address ADD_OUT. Alternatively, when it is determined that the indication bits R of the way parts of the tag group TGi are "1" (S60=NO) and that the second tag bits corresponding to a way part including the indication bit R are identical with the first way bits WAYP included in the input address ADD_IN, the translation logic circuit 321 changes the block bit part BP and the first way bits WAYP and outputs the input address ADD_IN' including the changed block bit part out_w=W=0 and the changed first way bits TAGP', and the index part INDEXP (S64). The changed first way bits TAGP' may be second tag bits. The address translator 320 may output the input address ADD_IN' as the output address ADD_OUT.

One possible algorithm that may be used to control the translation logic circuit 321 is as follows:

```
if(in_w==0) {
    if(tag11==in_tag && R11==1) {
        out_tag=Way0; out_w=1;
    } else if(tag12==in_tag && R12==1) {
        out_tag=Way1; out_w=1;
    } else ...{
        ...
    } else if(tag1m==in_tag && R1m==1) {
        out_tag=Waym; out_w=1;
    } else {
        out_tag=in_tag; out_w=0;
    }
} else
    if(in_tag==Way1 && R11==1) {
        out_tag=tag11; out_w=0;
    } else if(in_tag==Way2 && R12==1) {
        out_tag=tag12; out_w=0;
    } else ...{
        ...
    } else if(in_tag==Waym && R1m==1) {
        out_tag=tag1m; out_w=0;
    } else {
        out_tag=in_tag; out_w=1;
    }
}
```

Figure 15:
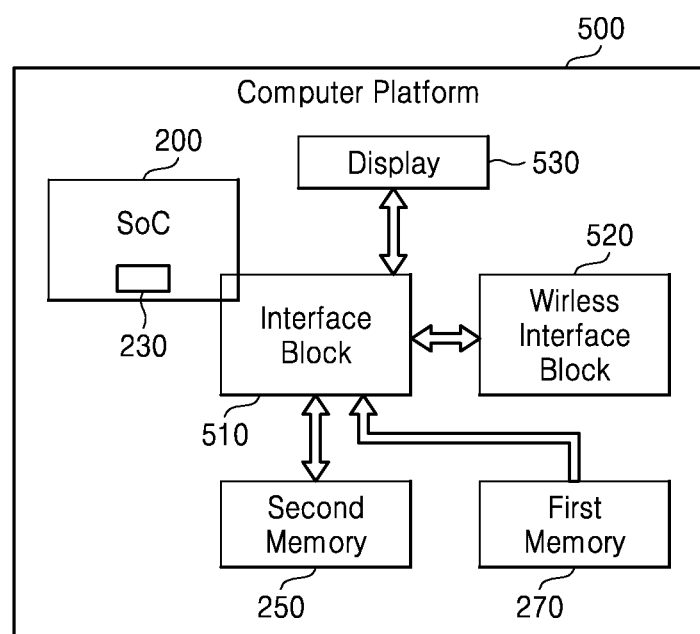
FIG. 15 is a block diagram of a computational system including a system on chip illustrated in FIG. 1, according to another embodiment of the inventive concept.

FIG. 15 is a block diagram illustrating a computational system 500 including the SoC 200 of FIG. 1 according to another embodiment of the inventive concept. Referring to FIG. 15, the computational system 500 is assumed to be a computer, such as the type that may be implemented as a PC, a server, or a portable electronic device.

The computer platform 500 includes the SoC 200 including the memory remapper 230, an interface block 510, the first memory 270, and the second memory 250, and may further include at least one of a wireless interface block 520 and a display 530. The SoC 200 communicates with the first memory 270, the second memory 250, the wireless interface block 520, and/or the display 530 via the interface block 510.

The interface block 510 includes one or more circuit blocks capable of performing various interface control functions. The interface control functions include memory access control, graphic control, input/output interface control, wireless network access control, or the like. Each of the circuit blocks may be implemented by using an independent chip, may be implemented as a part of the SoC 200, or may be implemented in the SoC 200.

The interface block 510 may include the elements 220, 240, and 260 of FIG. 1. The first memory 270 and/or the second memory 250 may give data to or receive data from the SoC 200 via the interface block 510. The wireless interface block 520 may connect the computer platform 500 to a wireless network, for example, a mobile communication network or a wireless local area network (LAN), via an antenna.

Figure 16:
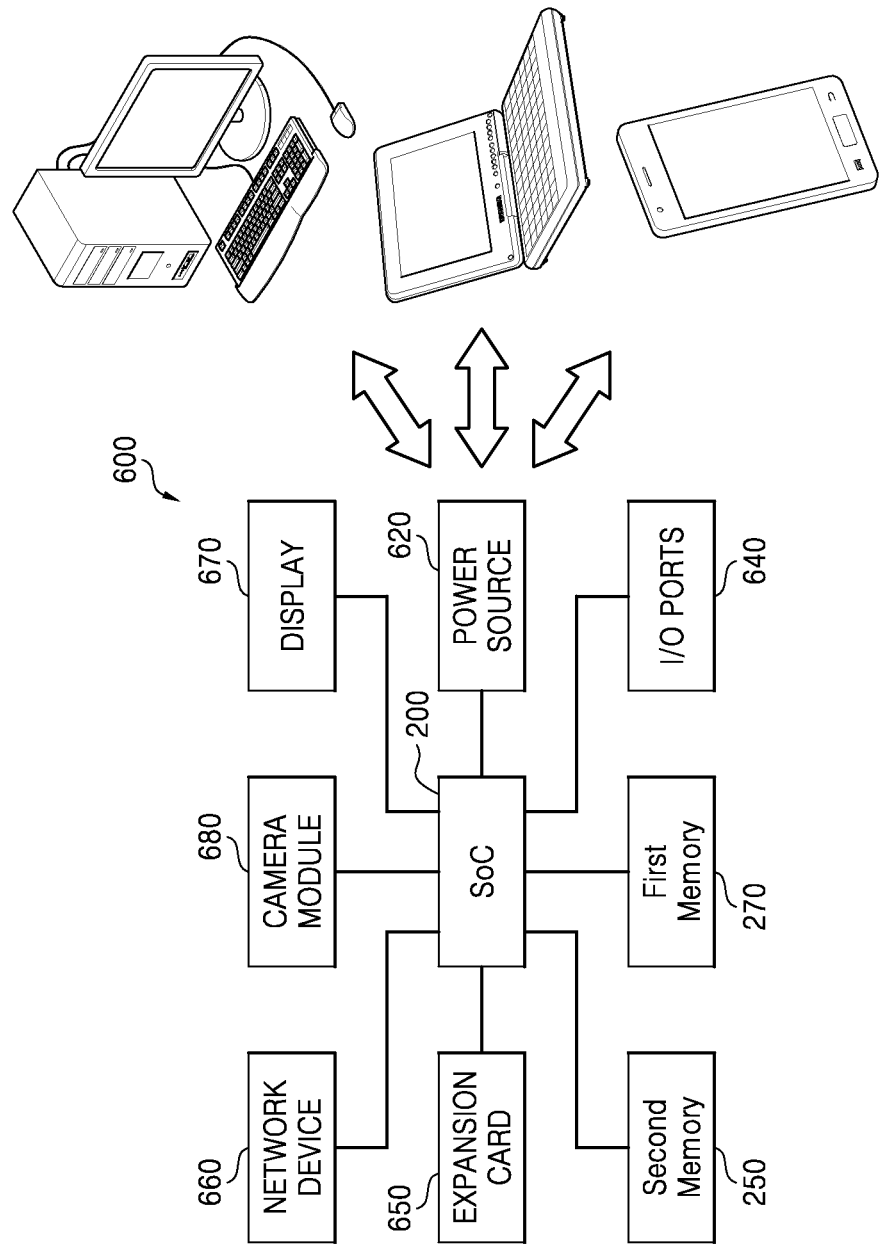
FIG. 16 is a block diagram of a computational system including the system on chip illustrated in FIG. 1, according to another embodiment of the inventive concept.

FIG. 16 is a block diagram illustrating a computational system 600 including the SoC 200 of FIG. 1 according to another embodiment of the inventive concept. Here again, the computational system 600 may be a PC, a server, a laptop computer, or a portable electronic device.

The computational system 600 may include the SoC 200, a power source 620, the first memory 270, the second memory 250, I/O ports 640, an expansion card 650, a network device 660, and a display 670. According to one particular embodiment, the computational system 600 further includes a camera module 680, and the SoC 200 may be used to control the operation of at least one of the elements 620 through 680.

The power source 620 may be used to supply one or more operational voltage(s) to at least one of the elements 200 and 630-680. The I/O ports 640 denote ports capable of communicating data to the computational system 600, and/or data output from the computational system 600 to an external device. For example, the I/O ports 640 may include at least one of a port for connecting a pointing device, such as a computer mouse, to the computational system 600, a port for connecting a printer to the computational system 600, and a port for connecting a USB drive to the computational system 600.

The expansion card 650 may be implemented by using a secure digital (SD) card or a multimedia card (MMC). In certain embodiments, the expansion card 650 may be a Subscriber Identification Module (SIM) card or a Universal Subscriber Identity Module (USIM) card.

The network device 660 denotes a device capable of connecting the computational system 600 to a wired or wireless network. The display 670 may display data output from the first memory 270, the second memory 250, the I/O ports 640, the expansion card 650, or the network device 660.

The camera module 680 denotes a module capable of converting an optical image into a corresponding electrical image signal. The electrical image signal output by the camera module 680 may be stored in the first memory 270 or in the expansion card 650. The electrical image signal output from the camera module 680 may be displayed on the display 670 under the control of the SoC 200.

Figure 17:
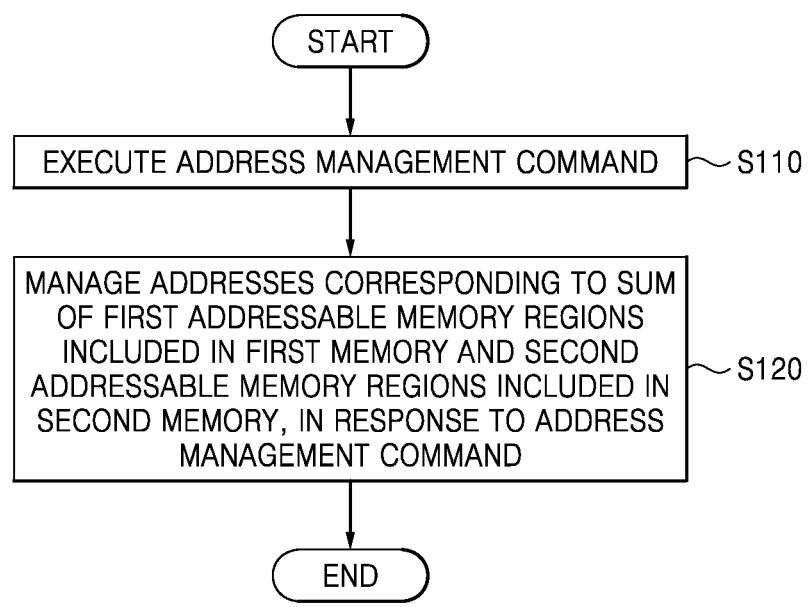
FIG. 17 is a flowchart of an operation of a processor, according to an embodiment of the inventive concept.

FIG. 17 is a flowchart summarizing one possible method of operating a processor according to an embodiment of the inventive concept.

Referring to FIGS. 1, 9, 11, 13, and 17, the computational system 100, which is here assumed to be a semiconductor device, may include a medium that stores computer program code, such as the first memory 270 or at least one of the processor cores 210-1 and 210-2.

When the computer program code is executed by at least one of the processor cores 210-1 and 210-2 (S110), the memory remapper 230 may perform the dynamic memory allocation management function, the dynamic memory reallocation management function, or the address management function described above with reference to FIGS. 1 to 14 under the control of the at least one of the processor cores 210-1 and 210-2 (S120).

The memory remapper 230 may manage addresses corresponding to a sum of first addressable memory regions included in the first memory 270 and second addressable memory regions included in the second memory 250.

In a method and/or a computational device according embodiments of the inventive concept, both the addresses of a main memory including addressable memory regions and the addresses of a wide I/O mobile DRAM including addressable memory regions may be efficiently managed.

Figure 18:
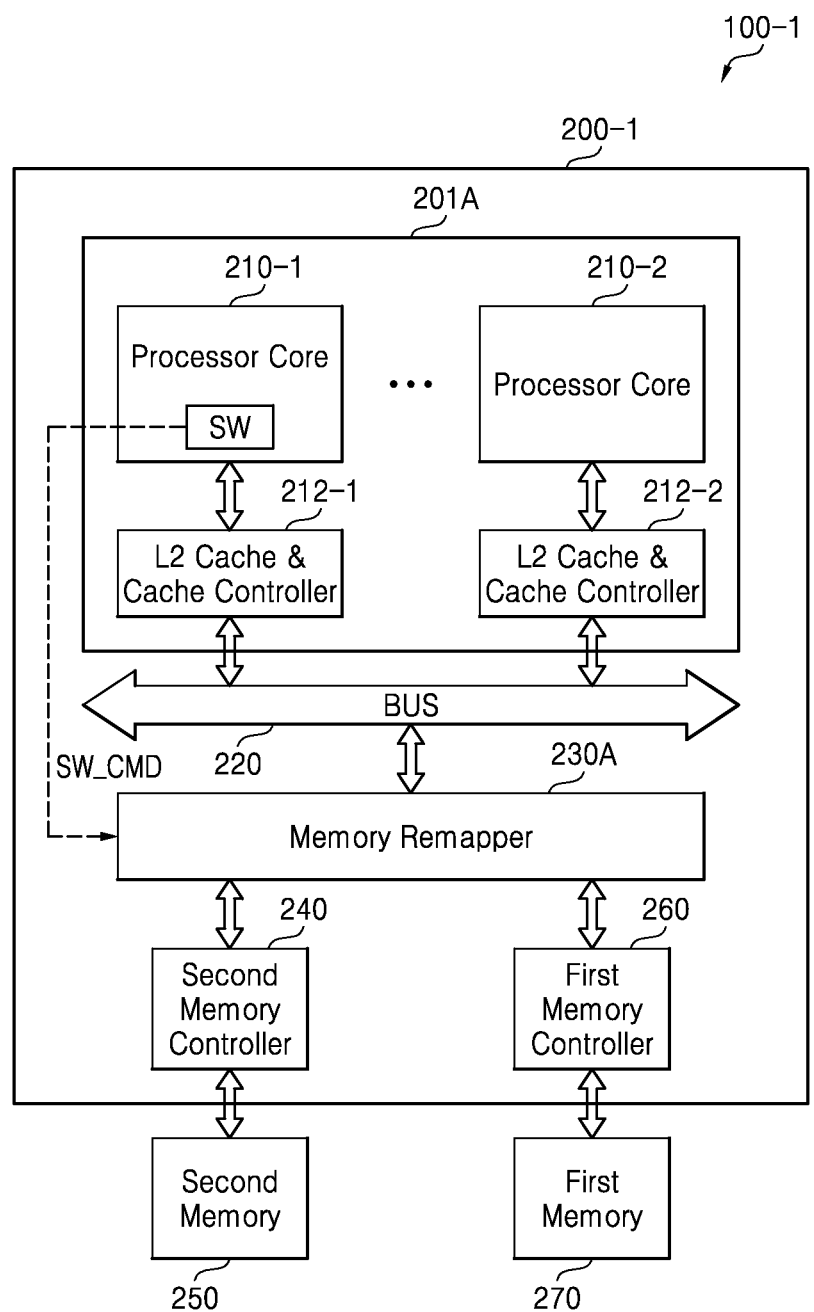
FIG. 18 is a block diagram of a computational system according to an another embodiment of the inventive concept.

FIG. 18 is a block diagram of a computing system according to another example embodiment of the present inventive concepts.

Referring to FIGS. 1 and 18, except that the memory remapper 230 of FIG. 1 is changed or replaced to a memory remapper 230A of FIG. 18, a structure and an operation of the computing system 100 of FIG. 1 are substantially the same as a structure and an operation of a computing system 100-1 of FIG. 18. In addition, an operation of the memory remapper 230 is substantially the same as an operation of the memory remapper 230A.

The computing system 100-1 includes a SoC 200-1 and heterogeneous memories 250 and 270. One, e.g., 210-1, of cores 210-1 and 210-2 of a multi-core processor 201A of the SoC 200-1 may execute software (SW). The SW may include an operating system (OS), a device driver, or an application.

The memory remapper 230 of FIG. 1 performs data swapping using the access history table 326-2 of FIG. 6; however, the memory remapper 230A of FIG. 18 may perform data swapping based on a software (SW)-controlled relocation command SW_CMD output from the SW executed by the core 210-1.

Figure 19:
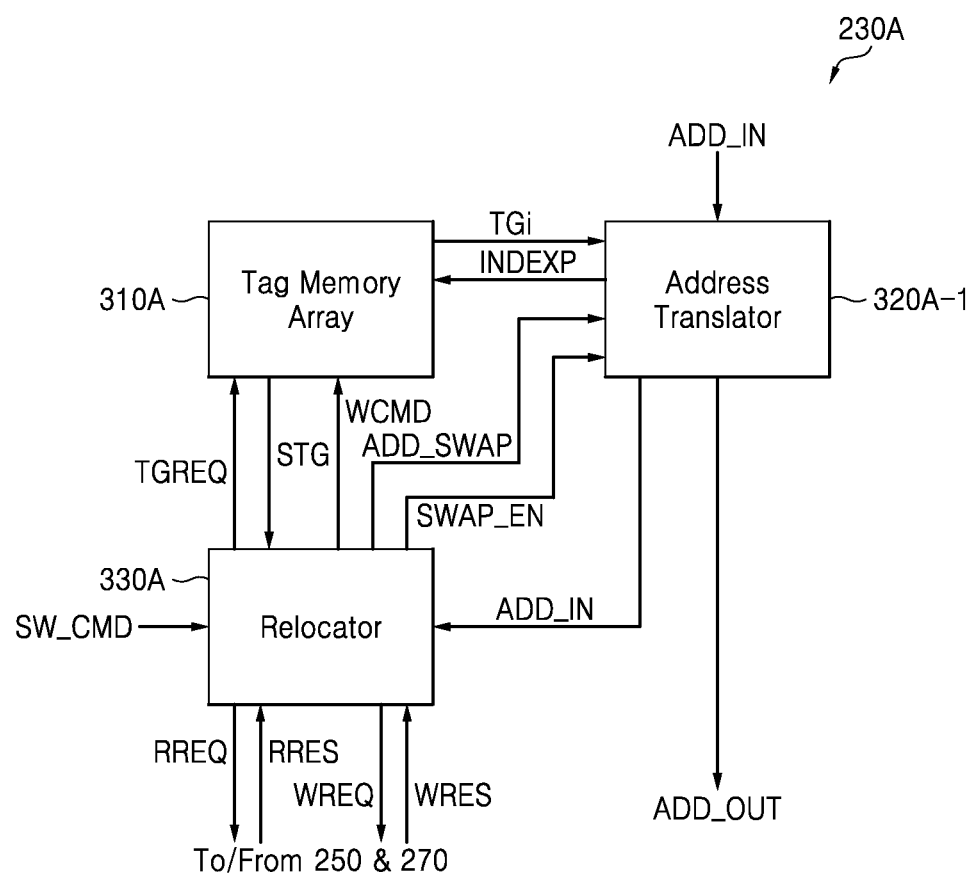
FIG. 19 is a block diagram of the memory remapper illustrated in FIG. 18.

FIG. 19 is a block diagram of the memory remapper illustrated in FIG. 18. A reallocation command RLCMD in FIG. 2 is generated by the address translator 320; however, a reallocation command in FIG. 19 is generated by the relocator 330A operating based on SW-controlled relocation command SW_CMD.

The memory remapper 230A includes a tag memory array 310A, an address translator 320-1, and the relocator 330A.

The tag memory array 310A stores a plurality of tag groups or tag sets or tag contents. Each of the plurality of tag groups may change or update information for changing an input address Add_IN into an output address ADD_OUT based on an update command WCMD.

The tag memory array 310A may output a tag group TGi of the plurality of tag groups to the address translator 320-1 based on an index part INDEXP output from the address translator 320-1. In addition, the tag memory array 310A may output one of the plurality of tag groups to the relocator 330A as a selection tag group STG based on a tag transmission request TGREG output from the relocator 330A.

Figure 20:
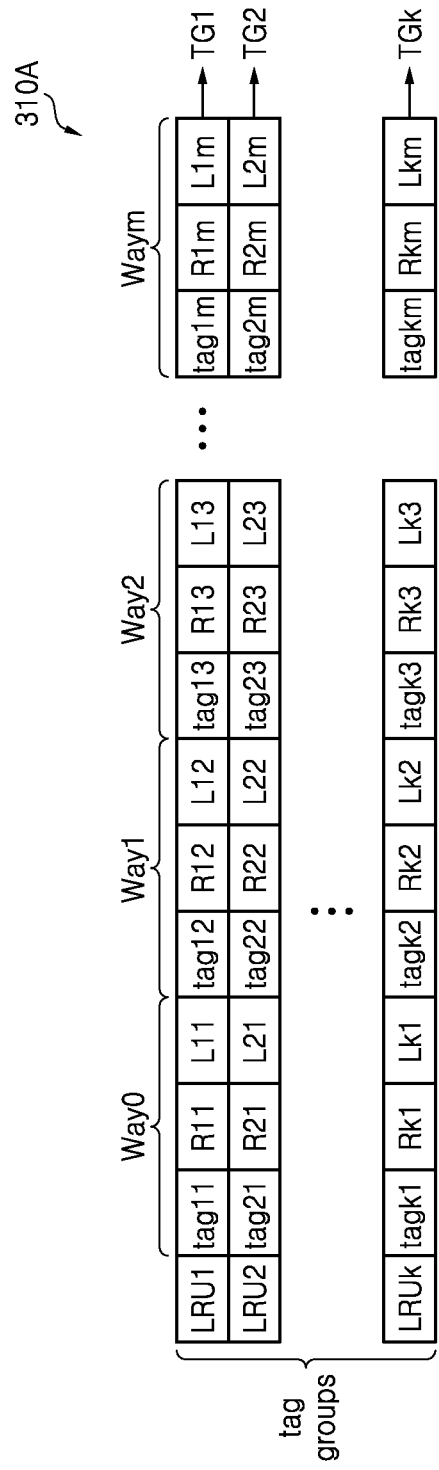
FIG. 20 illustrates a structure of the tag memory array illustrated in FIG. 19.

FIG. 20 illustrates a structure of the tag memory array illustrated in FIG. 19. Referring to FIG. 20, the tag memory array 310A includes a plurality of tag groups TG1 to TGk, where k is a natural number.

Each of the plurality of tag groups TG1 to TGk includes a least recently used (LRU) part LRU1 through LRUk and a plurality of way parts Way0 through Waym. Each of the plurality of way parts Way0 through Waym includes a tag bit part tagk1 through tagkm, an indication bit part Lk1 through Lkm, and a SW-controlled relocation bit part Lk1 through Lkm. Here, k and m are natural numbers, respectively.

Each indication bit part Rk1 through Rkm includes a bit representing whether data is swapped, for example, one bit. When the indication bit is 0, corresponding two data stored in heterogeneous memories 250 and 270 have not swapped each other. When the indication bit is 1, corresponding two data stored in heterogeneous memories 250 and 270 are swapped or may be swapped each other.

Each SW-controlled relocation bit part Lk1 through Lkm includes a bit representing whether data swapping is controlled by a SW, for example, one bit. When the SW-controlled relocation bit is 0, corresponding data stored in second memory 250 and corresponding data stored in first memory 270 may be swapped each other. When the SW-controlled relocation bit is 1, corresponding data stored in second memory 250 should be stored in the second memory 250 or surely need to be present in the second memory 250.

For example, when an indication bit is 1 and a SW-controlled relocation bit is 0, corresponding two data may be swapped, if necessary, data stored in the second memory 250 may be victim data.

Figure 21:
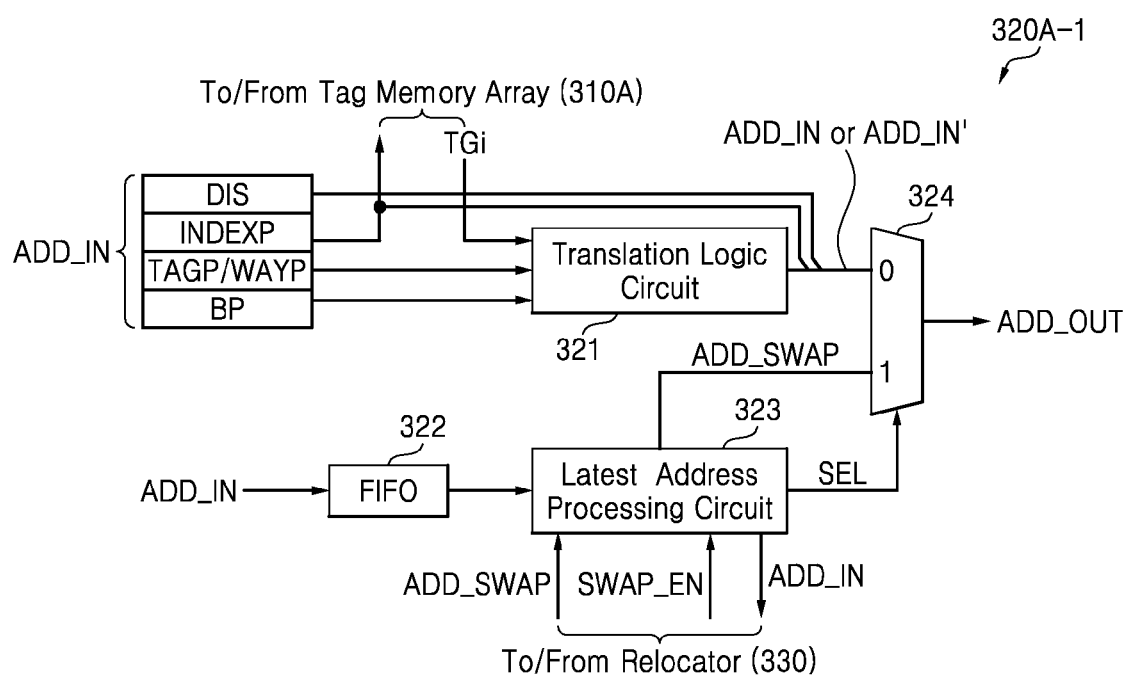
FIG. 21 is a block diagram illustrating an example embodiment of the address translator illustrated in FIG. 19.

FIG. 21 is a block diagram illustrating an example embodiment of the address translator illustrated in FIG. 19. An address translator 320A-1 of FIG. 22 differently from the address translator 320A of FIG. 5 does not include the relocation generator 325 and the relocation control logic circuit 326. The address translator 320A-1 does not use each SW-controlled relocation bit part included in a tag group TGi.

Figure 22:
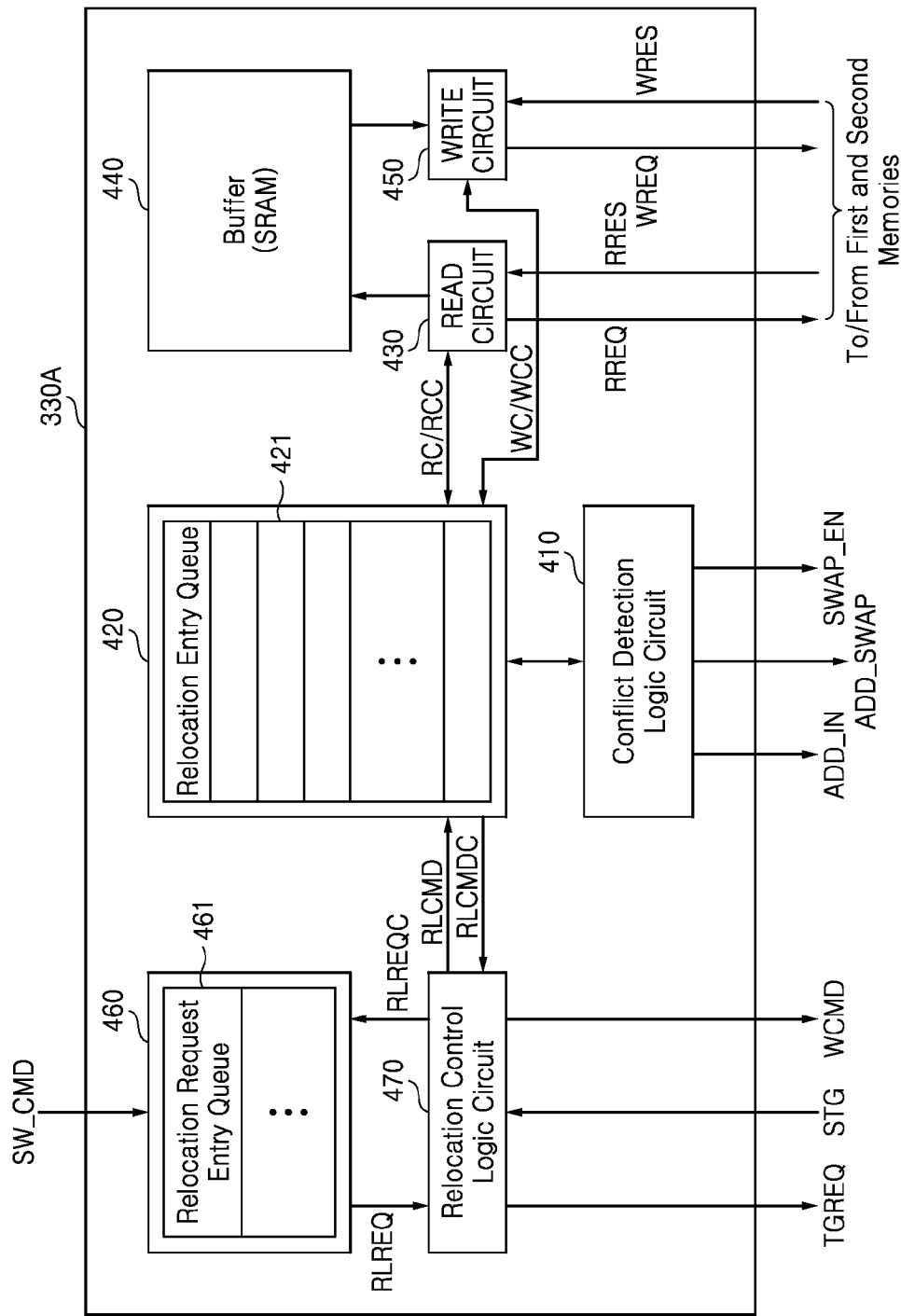

Accordingly, a function and an operation of each component 321, 322, 323, and 324 are substantially the same as a function and an operation of each component 321, 322, 323, and 324 of FIG. 22. Therefore, description for each component 321, 322, 323, and 324 of FIG. 22 will be omitted.

FIG. 22 is a block diagram of the relocator illustrated in FIG. 19.

Referring to FIG. 22, the relocator 330A includes a conflict detection logic circuit 410, a first interface 420 having a relocation entry queue 421, a read circuit 430, a buffer 440, a write circuit 450, a second interface 460 having a relocation request entry queue 461, and a relocation control logic circuit 470. For convenience of description in FIG. 23, it is illustrated each interface 420 and 460 includes each entry queue 421 and 461; however, each entry queue 421 and 461 may be embodied outside each interface 420 and 460, and each interface 420 and 460 may perform a function of hardware component controlling an operation of each entry queue 421 and 461.

The second interface 460 may manage the relocation request entry queue 461 in response to a SW-controlled relocation command SW_CMD.

Figure 25:
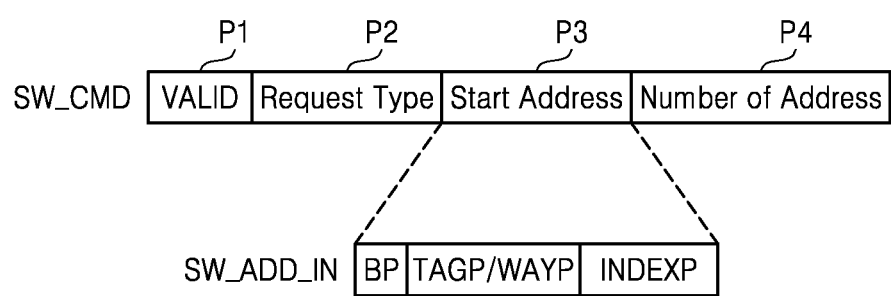
FIG. 25 illustrates a structure of a software-controlled relocation command.

The relocation request entry queue 461 may store one or more SW-controlled relocation commands SW_CMDs each identified by an identification number. The SW-controlled relocation command SW_CMD may include a first region P1, a second region P2, a third region P3, and a fourth region P4 as illustrated in FIG. 25.

The first region P1 may represent validity VALID of the SW-controlled relocation command SW_CMD, and include at least one bit. When a bit of the first region P1 is 1, the SW-controlled relocation command SW_CMD is valid.

The second region P2 may represent a request type of software, and include at least one bit. When the software SW requests a compulsory relocation, a bit of the second region P2 may be set to 1, and when the software SW releases a compulsory relocation, a bit of the second region P2 may be set to 0.

The third region P3 represents a start address of an address corresponding to data to be swapped to the second memory, and includes at least one bit. The start address denotes a software (SW) input address SW_ADD_IN. The SW input address SW_ADD_IN may include a block bit part BP, a tag part TAGP/WAYP, and an index part INDEXP. Here, the SW input address SW_ADD_IN does not include a displacement part.

The fourth region P4, as an optional region, may represent the number of addresses which succeed to the start address and correspond to each of a plurality of data to be swapped to the second memory 250, and include at least one bit.

The second interface 460 outputs a relocation request RLREQ to the relocation control logic circuit 470.

Figure 23:
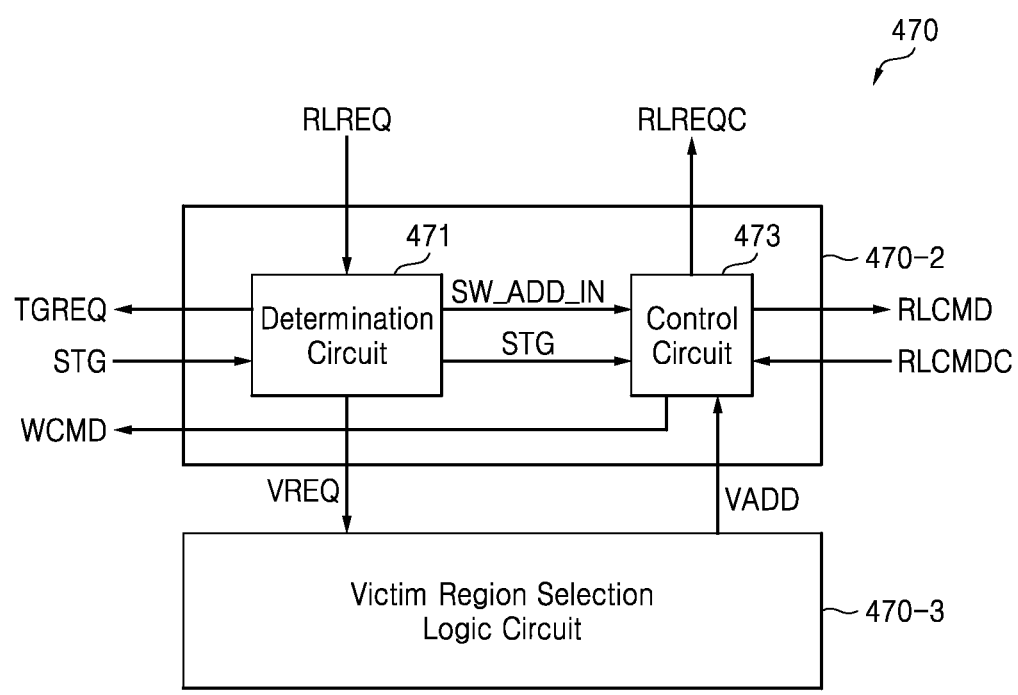
FIG. 23 is a block diagram of a relocation control logic circuit illustrated in FIG. 22.
Figure 24:
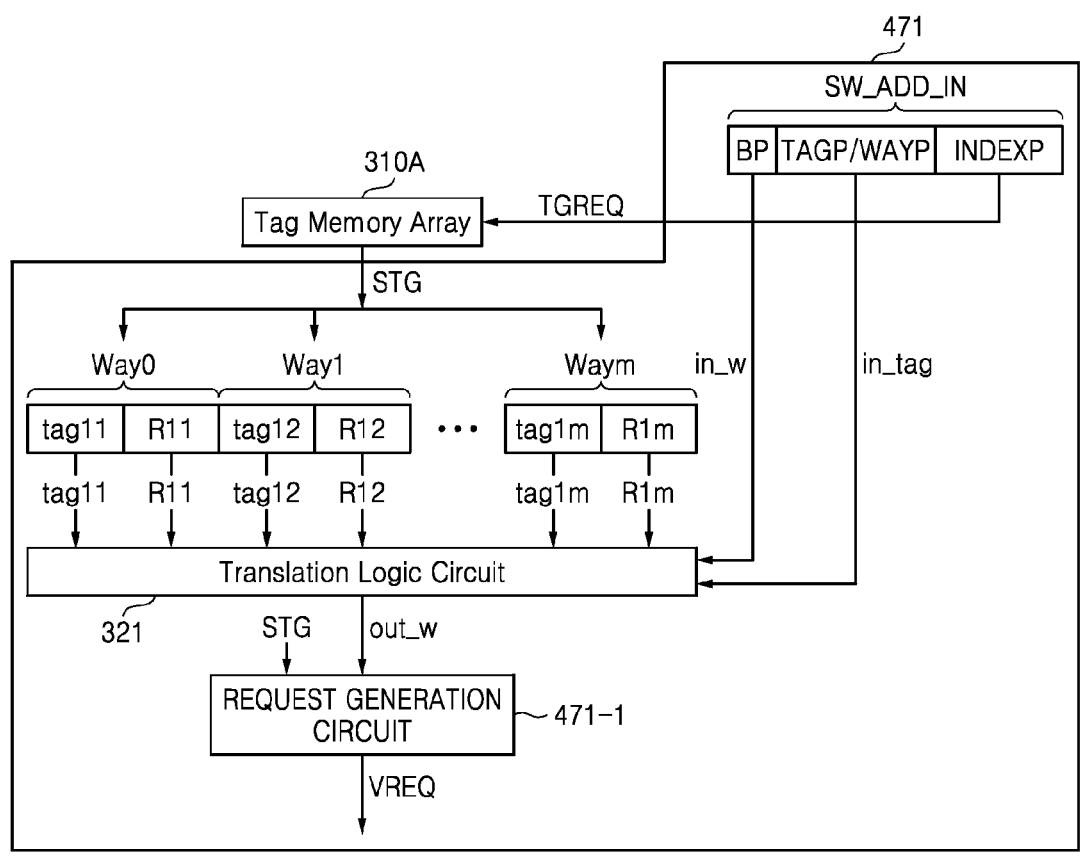
FIG. 24 is a block diagram of a determination circuit illustrated in FIG. 23.

FIG. 23 is a block diagram of the relocation control logic circuit of FIG. 22 and FIG. 24 is a block diagram of a determination circuit of FIG. 23. Referring to FIG. 23, the relocation control logic circuit 470 includes a region relocation control logic circuit 470-2 and a victim region selection logic circuit 470-3.

The region relocation control logic circuit 470-2 a determination circuit 471 and a control circuit 473.

The determination circuit 471 transmits a tag transmission request TGREQ to a tag memory array 310A in response to a relocation request RLREQ. The tag transmission request TGREQ may include an index part INDEXP included in a SW input address SW_ADD_IN.

The tag memory array 310A may output one of the plurality of tag groups TG1 through TGk to the determination circuit 471 as a selection tag group STG based on a index part INDEXP included in the tag transmission request TGREG.

The determination circuit may include a translation logic circuit 321 and a request generation circuit 471-1. An operation of the translation logic circuit 321 of FIG. 24 is substantially the same as an operation of the translation logic circuit 321 of FIG. 4.

The request generation circuit 471-1 may generate a victim region selection request VREQ based on an output signal out_w of the translation logic circuit 321 and transmit the victim region selection request VREQ to the victim region selection logic circuit 470-3.

For example, when an output signal out_w of the translation logic circuit 321 is 0, corresponding data is stored in the first memory 270. Accordingly, data swap is needed. However, when an output signal out_w of the translation logic circuit 321 is 1, corresponding data is stored in the second memory 250. Accordingly, data swap is not needed.

When an output signal out_w of the translation logic circuit 321 is 0, the request generation circuit 471-1 may transmit a victim region selection request VREQ to the victim region selection logic circuit 470-3 based on a search tag group STG. According to some embodiments, the victim region selection request VREQ may include the search tag group STG, each SW-controlled relocation bit per way part included in the search tag group STG, or an LRU part and each SW-controlled relocation bit per way part included in the search tag group STG.

The victim region selection logic circuit 470-3 may transmit a victim (region) address VADD for a victim region to a control circuit 473 based on the victim region selection request VREQ. The control circuit 473 may transmit a relocation command RLCMD including a SW input address SW_ADD_IN and a victim (region) address VADD to the first interface 420.

FIGS. 26A and 26B are a conceptual diagram for describing a process of describing a method of setting a software-control relocation bit.

A method of setting a SW-controlled relocation bit of a first tag group TG1 to 1 is exemplarily described referring to FIGS. 18 to 26.

First of all, in order to request relocation, it is assumed that the first region P1 is set to 1, the second region P2 is set to 1, and the third region P3 is set to 2'b0000.

The software SW outputs a SW-controlled relocation command SW_CMD to the relocator 230A before outputting an input address ADD_IN.

The second interface 460 of the relocator 330A writes the SW-controlled relocation command SW_CMD in the relocation request entry queue 461, and then outputs a relocation request RLREQ to the region relocation control logic circuit 470-2 of the relocation control logic circuit 470.

Here, the relocation request RLREQ may be a command related to the SW-controlled relocation command SW_CMD. For example, the relocation request RLREQ may include the second region P2 and the third region P3. The region relocation control logic circuit 470-2 transmits a tag transmission request TGREQ including an index part INDEXP=0 included in a SW input address SW_ADD_IN to the tag memory array 310A.

The tag memory array 310A transmits the first tag group TG1 among a plurality of tag groups TG1 to TGk to the determination circuit 471 as a search tag group STG based on a tag transmission request TGREQ including the index part INDEXP=0.

The determination circuit 471 analyzes a search tag group STG=TG1 illustrated in FIG. 26A. As a result of analysis, since an output signal out_w of the translation logic circuit 321 of FIG. 24 is 0 and a SW-control relocation bit L of a first way part Way0 is 0, determination circuit 471 transmits a victim region selection request VREQ to the victim region selection logic circuit 470-3.

For consistency of description, when a memory region corresponding to an address Addr8=1000 is assumed to be a victim region, the victim region selection logic circuit 470-3 selects a memory region corresponding to an address Addr8=1000 as a victim region, and outputs the address Addr8=1000 to the control circuit 473 as a victim address VADD.

The victim region selection logic circuit 470-3 may select a victim region according to a first-in-first-out method, a sequential method, randomly or referring to LUR part included in a corresponding tag group. According to example embodiments, a method of selecting the victim region may be variously changed.

When the victim address VADD is transmitted to the control circuit 473, the control circuit 473 transmits a relocation command RLCMD to the first interface 420. As described above, the relocation command RLCMD may include an enable signal, addresses necessary for a data swap operation, e.g., a SW input address SW_ADD_IN=0000 and a victim address VADD=1000, and/or an indication signal indicating a method of data swap operation.

An operation of each component 410, 420, 421, 430, 440, and 450 included in the relocator 330A of FIG. 22 is substantially the same as an operation of each component 410, 420, 421, 430, 440, and 450 included in the relocator 330A of FIG. 4.

Accordingly, data stored in a memory region of the first memory 270 corresponding to the SW input address SW_ADD_IN=0000 are swapped with data stored in a memory region of the second memory corresponding to the victim address VADD=1000 according to a swap operation.

The first interface 420 outputs a relocation completion command RLCMDC to the control circuit 473 based on a write completion command WCC, and transmits an update command WCMD including information needed to set a SW-controlled relocation bit L of the first way part Way0 to 1 to the tag memory array 310A.

Here, the control circuit 473 may transmit a relocation request completion RLREQC to the second interface 460, and the second interface 460 may transmit an indication signal indicating completion of the SW-controlled relocation command SW_CMD to software SW. The tag memory array 310A sets a SW-controlled relocation bit L of the first way part Way0 of the first tag group TG1 to 1 based on an update command WCMD.

Afterwards, when the software SW output an input address ADD_IN=0000, the address translator 320A-1 outputs an output address ADD_OUT, i.e., the victim address VADD=1000, based on the first tag group TG1 including the SW-controlled relocation bit L of the first way part Way0 set to 1. Accordingly, the multi-core processor 201A may access data CCCC stored in a memory region of the second memory 250 corresponding to an output address ADD_OUT=1000.

In case, when the tag memory array 310A transmits the first tag group TG1 illustrated in FIG. 26B to the determination circuit 471 as a search tag group STG in response to a tag transmission request TGREQ, the determination circuit 471 analyzes the search tag group STG=TG1 illustrated in FIG. 26B.

Here, since an output signal out_w of the translation logic circuit 321 is 1 and the SW-controlled relocation bit L of the first way part Way0 is 1, the control 473 under the control of the determination circuit 471 may transmit a relocation request completion RLREQC to the second interface 460, and the second interface 460 may transmit an indication signal indicating completion of the SW-controlled relocation command SW_CMD to the software SW.

Continuously, in order to release relocation, it is assumed that the first region P1 is set to 1, the second region P2 is set to 0, and the third region P3 is set to 2'b0011.

For consistency of description, it is assumed that data stored in a memory region of the first memory 270 corresponding to an address Addr3=0011 are swapped with data stored in a memory region of the second memory 250 corresponding to an address Addr11=1011.

The software SW outputs the SW-controlled relocation command SW_CMD to the relocator 230A before outputting an input address ADD_IN=0011.

The second interface 460 of the relocator 330A writes the SW-controlled relocation command SW_CMD in the relocation request entry queue 461, and then outputs a relocation request RLREQ to the region relocation control logic circuit 470-2 of the relocation control logic circuit 470. The region relocation control logic circuit 470-2 transmits a tag transmission request TGREQ including an index part INDEXP=1 included in a SW input address SW_ADD_IN to the tag memory array 310A.

The tag memory array 310A transmits a second tag group TG2 among the plurality of tag groups TG1 through TGk to the region relocation control logic circuit 470-2 as the search tag group STG based on a tag transmission request TGREQ including the index part INDEXP=1.

The region relocation control logic circuit 470-2 analyzes a search tag group STG=TG2 illustrated in FIG. 26A. As a result of the analysis, since a SW-controlled relocation bit L of a second way part Way1 is 1, the region relocation control logic circuit 470-2 transmits an update command WCMD including information needed to set the SW-controlled relocation bit L of the second way part Way2 to 0 to the tag memory array 310A in order to release relocation.

Here, the region relocation control logic circuit 470-2 may transmit a relocation request completion RLREQC to the second interface 460, and the second interface 460 may transmit an indication signal indicating completion of the SW-controlled relocation command SW_CMD to the software SW.

The tag memory array 310A sets the SW-controlled relocation bit L of the second way part Way2 of a second tag group TG2 in FIG. 26B to 0 based on the update command WCMD.

A numeral number 200 in FIGS. 15 and 16 collectively represents the SoC 200 and 200-1, and a numeral number 230 in FIG. 15 collectively represents the memory remapper 230 and 230A.

The relocator 330A may set or program a SW-controlled relocation bit in included in a tag memory array 310A based on a SW-controlled relocation command SW_CMD.

While the inventive concept has been particularly shown and described with reference to exemplary embodiments thereof, it will be understood that various changes in form and details may be made therein without departing from the scope of the following claims.

What is claimed is:

1. A system comprising:
   a system on chip (SoC) including a memory remapper, a first memory controller, a second memory controller and a processor configured to control the memory remapper;
   a first memory; and
   a second memory stacked on the SoC, and configured to operate faster than the first memory, the second memory being a wide input/output (I/O) mobile dynamic random access memory (DRAM),
   wherein the first memory controller receives first access control signals from the memory remapper, and controls an access operation with respect to the first memory based on the first access control signals,
   wherein the second memory controller receives second access control signals from the memory remapper, and controls an access operation with respect to the second memory based on the second access control signals,
   wherein the memory remapper performs a memory operation between the first memory and the second memory, by moving first data stored in the first memory to the second memory, by moving second data stored in the second memory to the first memory, and/or by swapping the first data and the second data, and
   wherein the memory remapper includes:
   a tag memory array configured to store a plurality of tag groups, each of the plurality of tag groups updating information used to change an input address into a corresponding output address;
   an address translator configured to receive the input address and to generate a relocation command including the input address and the corresponding output address necessary for data swapping; and
   a relocator configured to control the data swapping between the first memory and the second memory in response to the relocation command.

2. The system of claim 1, wherein data that is frequently accessed is stored in the second memory.

3. The system of claim 1, wherein the memory remapper manages a data copying operation between the first memory and the second memory.

4. The system of claim 1, wherein the first memory is a dynamic random access memory (DRAM).

5. The system of claim 1, wherein the first memory is a main memory and the second memory is a cache memory.

6. The system of claim 1, wherein the memory remapper outputs to the first memory controller and/or the second memory controller an address for the memory operation.

7. The system of claim 1, wherein capacity and power consumption of the second memory is less than those of the first memory.

8. The system of claim 1, wherein the processor is a multi-core processor that includes at least two processor cores.

9. The system of claim 8, wherein each of the at least two processor cores communicates with the memory remapper.

10. The system of claim 8, wherein the memory remapper performs the memory operation based on a command that is outputted from one of the at least two processor cores.

11. A system comprising:
a system on chip (SoC) including a memory remapper, a first memory controller, a second memory controller and a processor configured to control the memory remapper;
a first memory; and
a second memory stacked on the SoC and configured to operate faster than the first memory, the second memory being a wide input/output (I/O) mobile dynamic random access memory (DRAM),
wherein the first memory controller receives first access control signals from the memory remapper, and controls an access operation with respect to the first memory based on the first access control signals,
wherein the second memory controller receives second access control signals from the memory remapper, and controls an access operation with respect to the second memory based on the second access control signals,
wherein the memory remapper controls operations for first data stored in the first memory and for second data stored in the second memory,
wherein the memory remapper outputs to the first memory controller and/or the second memory controller an address for data reallocation, and
wherein the memory remapper includes:
a tag memory array configured to store a plurality of tag groups, each of the plurality of tag groups updating information used to change an input address into a corresponding output address;
an address translator configured to receive the input address and to generate a relocation command including the input address and the corresponding output address necessary for data swapping; and
a relocator configured to control the data swapping between the first memory and the second memory in response to the relocation command.

12. The system of claim 11, wherein the first memory is a DRAM.

13. The system of claim 11, wherein the memory remapper controls data swapping between the first memory and the second memory or data moving between the first memory and the second memory.

14. The system of claim 11, wherein the processor is a multi-core processor that includes at least two processor cores.

15. The system of claim 11, wherein the processor includes:
a first processor core:
a second processor core:
a first cache controller configured to communicate with the first processor core; and
a second cache controller configured to communicate with the second processor core.

16. A system comprising:
a system on chip (SoC) including a memory remapper, a first memory controller, a second memory controller and a multi-core processor configured to control the memory remapper;
a first memory having first memory regions; and
a second memory stacked on the SoC and having second memory regions, the second memory being configured to operate faster than the first memory and to store data that is frequently accessed,
wherein the first memory controller receives first access control signals from the memory remapper, and controls an access operation with respect to the first memory based on the first access control signals,
wherein the second memory controller receives second access control signals from the memory remapper, and controls an access operation with respect to the second memory based on the second access control signals,
wherein the memory remapper manages addresses corresponding to a sum of the first memory regions and the second memory regions,
wherein the first memory and the second memory are heterogeneous memories to each other, and
wherein the memory remapper includes:
a tag memory array configured to store a plurality of tag groups, each of the plurality of tag groups updating information used to change an input address into a corresponding output address;
an address translator configured to receive the input address and to generate a relocation command including the input address and the corresponding output address necessary for data swapping; and
a relocator configured to control the data swapping between the first memory and the second memory in response to the relocation command.

17. The system of claim 16, wherein the memory remapper controls data swapping that is performed on first data stored in the first memory and second data stored in the second memory.

18. The system of claim 16, wherein the memory remapper manages addresses for the first memory regions of the first memory and addresses for the second memory regions of the second memory, and controls operations for first data stored in the first memory regions and for second data stored in the second memory regions.

19. The system of claim 16, wherein the first memory is a dynamic random access memory (DRAM), and the second memory is a wide input/output (I/O) DRAM.

* * * * *